US010242325B2

(12) United States Patent
Takigawa et al.

(10) Patent No.: US 10,242,325 B2
(45) Date of Patent: Mar. 26, 2019

(54) MACHINE LEARNING APPARATUS, LASER APPARATUS AND MACHINE LEARNING METHOD

(71) Applicant: FANUC CORPORATION, Yamanashi (JP)

(72) Inventors: Hiroshi Takigawa, Yamanashi (JP); Michinori Maeda, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 166 days.

(21) Appl. No.: 15/454,724

(22) Filed: Mar. 9, 2017

(65) Prior Publication Data

US 2017/0262772 A1    Sep. 14, 2017

(30) Foreign Application Priority Data

Mar. 10, 2016  (JP) ................. 2016-047324

(51) Int. Cl.
| | |
|---|---|
| *G06N 99/00* | (2010.01) |
| *G06N 5/04* | (2006.01) |
| *H01S 5/024* | (2006.01) |
| *H01S 5/042* | (2006.01) |
| *G05B 23/02* | (2006.01) |

(Continued)

(52) U.S. Cl.
CPC ....... *G06N 99/005* (2013.01); *G05B 23/0283* (2013.01); *G06N 3/0427* (2013.01); *G06N 5/04* (2013.01); *H01S 5/02423* (2013.01); *H01S 5/042* (2013.01); *H01S 5/0021* (2013.01); *H01S 5/0683* (2013.01); *H01S 5/06808* (2013.01); *H01S 5/4025* (2013.01)

(58) Field of Classification Search
CPC ............ G05B 23/0283; H01S 5/06808; H01S 5/2001; H01S 5/0028
See application file for complete search history.

(56) References Cited

U.S. PATENT DOCUMENTS 7,835,642 B2 * 11/2010 Nelson ................... H04B 10/40
398/23
9,204,514 B2   12/2015 Steinle et al.
(Continued)

FOREIGN PATENT DOCUMENTS

| CN | 1808800 A | 7/2006 |
|---|---|---|
| CN | 102447217 A | 5/2012 |

(Continued)

*Primary Examiner* — Stanley K. Hill
(74) *Attorney, Agent, or Firm* — RatnerPrestia

(57) ABSTRACT

A machine learning apparatus includes: a state amount observation unit that observes a state amount of a laser apparatus including output data from an optical output detection unit, an optical output characteristic recording unit that records history of a driving current and optical output characteristics, and a driving condition/state amount recording unit that records history of a LD unit driving condition data and the state amount; an operation result acquisition unit that acquires a prediction result of characteristics and measurement result of optical output characteristics of the LD unit; a learning unit that learns the LD unit driving condition data with the state amount and the results of the LD unit driving condition data; and a decision-making unit that decides, from a learning result, the LD unit driving condition data.

16 Claims, 14 Drawing Sheets

(51) Int. Cl.
  *G06N 3/04*   (2006.01)
  *H01S 5/00*   (2006.01)
  *H01S 5/40*   (2006.01)
  *H01S 5/068*  (2006.01)
  *H01S 5/0683* (2006.01)

(56) References Cited

U.S. PATENT DOCUMENTS

2006/0159140 A1  7/2006  MacHida et al.
2012/0263202 A1  10/2012 Steinle et al.

FOREIGN PATENT DOCUMENTS

| CN | 103479319 A | 1/2014 |
| JP | H08-279642 A | 10/1996 |
| JP | 2005235075 A | 9/2005 |
| JP | 2005-294493 A | 10/2005 |
| JP | 2005-317178 A | 11/2005 |
| JP | 2005-317841 A | 11/2005 |
| JP | 2006-222411 A | 8/2006 |
| JP | 2009222620 A | 10/2009 |
| JP | 2011-086496 A | 4/2011 |
| JP | 2012-15440 A | 1/2012 |

\* cited by examiner

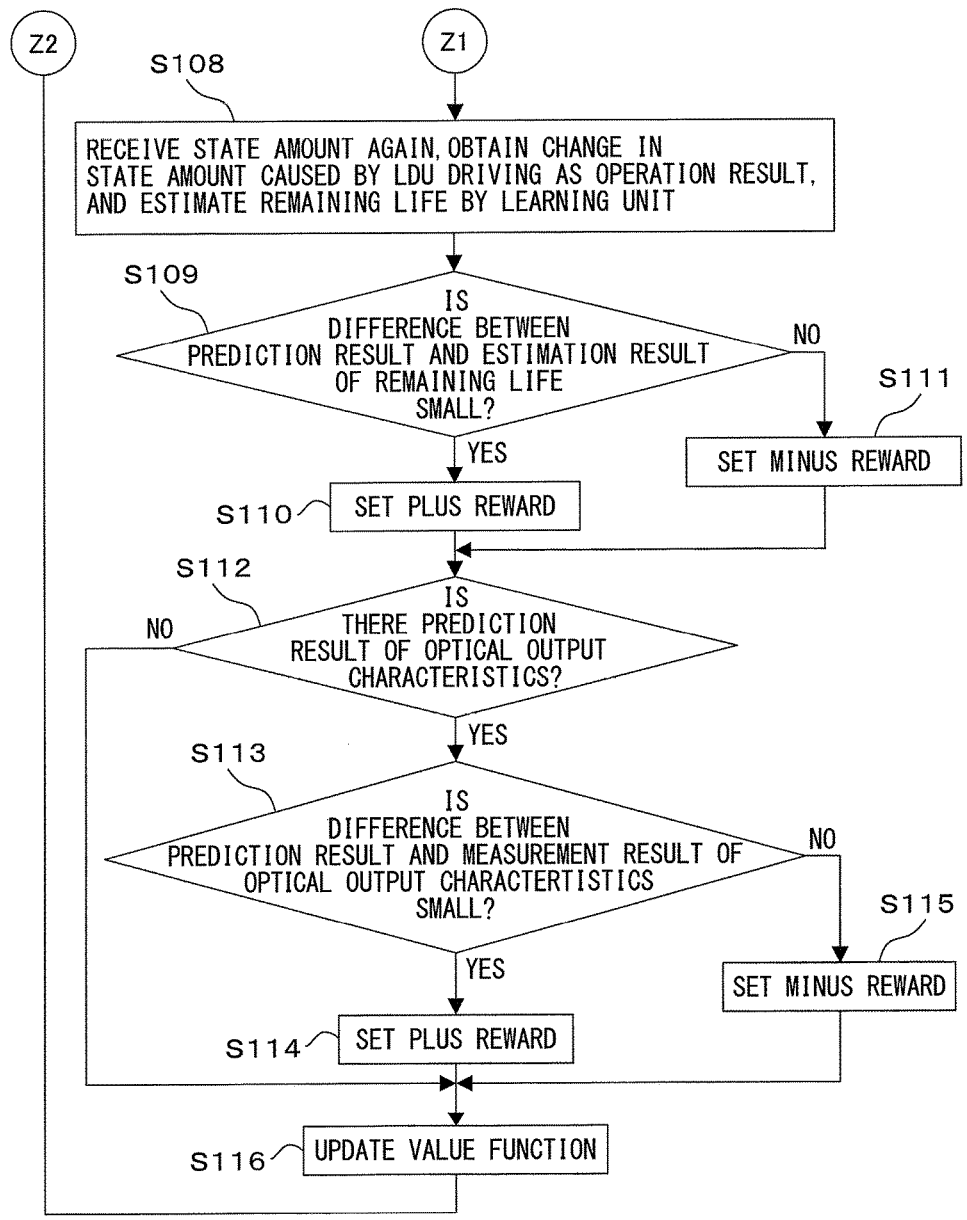

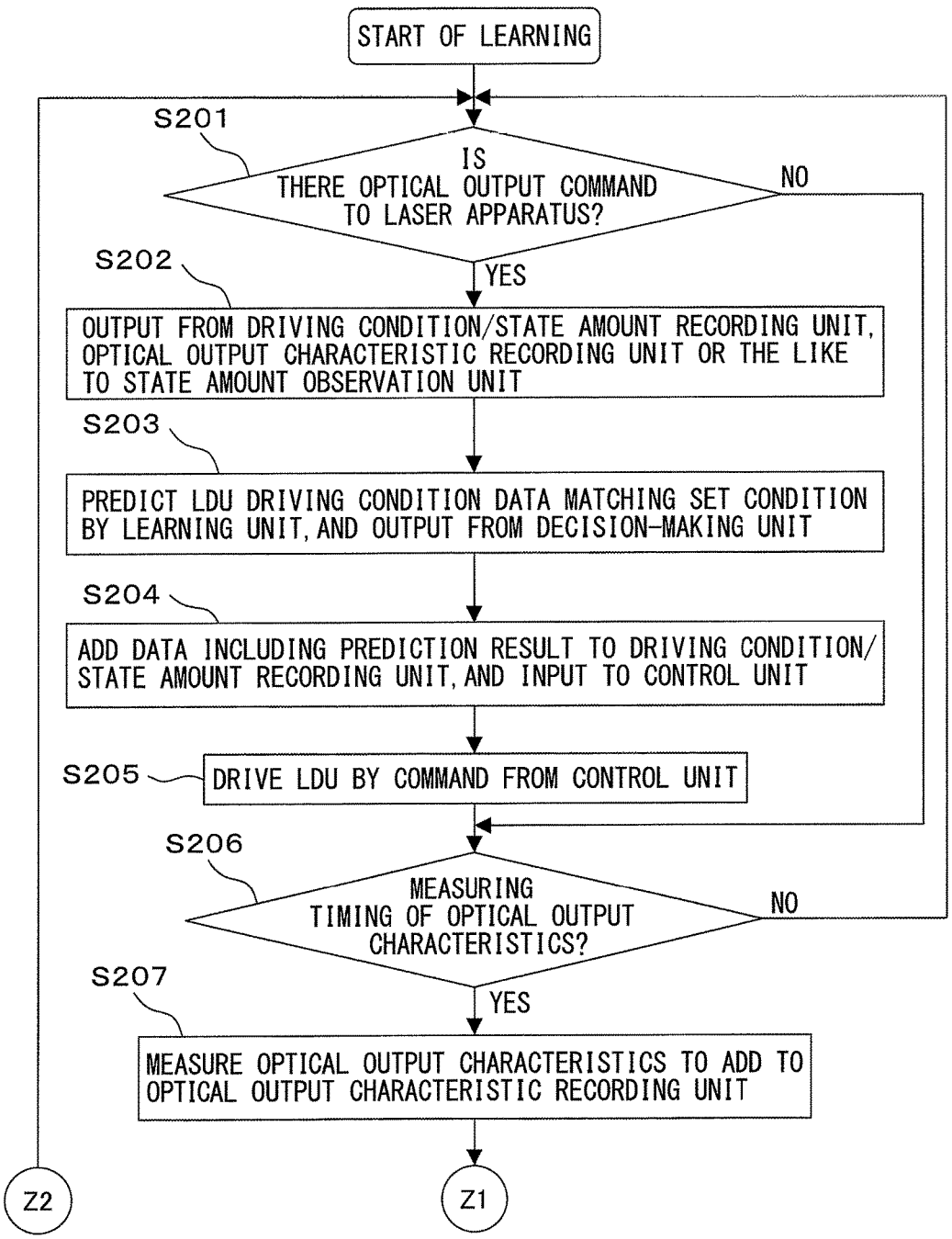

MACHINE LEARNING APPARATUS, LASER APPARATUS AND MACHINE LEARNING METHOD

BACKGROUND OF THE INVENTION

1. Field of the Invention

The present invention relates to a laser apparatus that uses many laser diodes (LD) as laser light sources or excitation light sources for laser oscillation, and a machine learning apparatus and a machine learning method for learning data relating to LD driving conditions of such a laser apparatus.

2. Description of the Related Art

In a high-output laser apparatus using an LD, many LDs may be used. Therefore, a plurality of laser diode modules (LDM) including at least one LD are prepared. Typically, the laser apparatus includes a plurality of LDMs, and is provided with a plurality of independently drivable laser diode units (LDU, LD unit).

In the laser apparatus using the LD, it is significant to know a remaining life of the LD, and there are a plurality of documents on conventional technologies. The remaining life means a life remaining until its end. However, the remaining life may vary depending on subsequent driving conditions of the LD. The remaining life herein means a remaining life when the laser apparatus is driven on a standard driving condition.

For example, Japanese Unexamined Patent Publication (Kokai) No. 8-279642 discloses that "the life of the light emitting element is predicted by using a driving current value for emitting a specific optical output as a reference value and a driving current larger by n times than the reference value as a deterioration threshold current for replacing the light emitting element".

Further, Japanese Unexamined Patent Publication (Kokai) No. 2005-294493 discloses that "control is performed so as to keep constant an output of each laser oscillator and set power at the processing point equal to predetermined power, and the life of the excitation LD is predicted".

Further, Japanese Unexamined Patent Publication (Kokai) No. 2005-317178 discloses that "time-sequential data relating to the increase of a generated heat amount caused by deterioration of the semiconductor laser is created, and the life of the semiconductor laser is predicted based on the time-sequential data relating to the increase of the generated heat amount".

Further, Japanese Unexamined Patent Publication (Kokai) No. 2006-222411 discloses that "the life of the excitation light source is estimated by using a current value supplied from the power source to the excitation light source when a signal output from the power sensor satisfies a predetermined condition and an operation time stored in the memory".

Further, Japanese Unexamined Patent Publication (Kokai) No. 2011-86496 discloses that "a characteristic variation amount that is a difference between current intensity characteristics deteriorated due to use and ideal characteristics is compared with an allowable variation amount to predict a replacement timing of the laser light source".

Further, Japanese Unexamined Patent Publication (Kokai) No. 2012-15440 discloses that "when cumulative time of time points when a driving current exceeding a predetermined deterioration threshold current flows through the laser diode exceeds a threshold time preset for each ambient temperature, the life of the laser diode is determined to be nearing its end".

Further, Japanese Unexamined Patent Publication (Kokai) No. 2005-317841 discloses that "by using a driving current time product, the deterioration degrees of the laser diode elements 1a, 1b, and 1c can be managed in a form appropriate to an actual situation".

SUMMARY OF THE INVENTION

However, in Japanese Unexamined Patent Publication (Kokai) No. 8-279642, it is only determined that the life has reached its end when the driving current for emitting the specific optical output exceeds the deterioration threshold current. There is disclosed no method for deriving a quantitative remaining life.

Japanese Unexamined Patent Publication (Kokai) No. 2005-294493 does not disclose any specific method for deriving a remaining life. In Japanese Unexamined Patent Publication (Kokai) No. 2005-294493, "to keep constant the output of each laser oscillator" is described. Thus, the life cannot be accurately predicted when the light source is driven on various optical output conditions, namely, from a low output to a high output and from a continuous laser output to a pulse laser optical output.

The technology disclosed in Japanese Unexamined Patent Publication (Kokai) No. 2005-317178 can predict the life only when the optical output is on a constant driving condition. The technology disclosed in Japanese Unexamined Patent Publication (Kokai) No. 2005-317178 cannot predict the life until the generated heat amount increases due to appearance of deterioration of the semiconductor laser.

In Japanese Unexamined Patent Publication (Kokai) No. 2006-222411, the operation time is always integrated under a condition where an output is rated. Therefore, when the laser apparatus is operated midway on a different condition, it is difficult to calculate an effective operation time.

In Japanese Unexamined Patent Publication (Kokai) No. 2011-86496, the deteriorated current intensity characteristics are used, and thus the remaining life cannot be estimated until deterioration appears. When a deterioration speed changes at an accelerated rate, it is difficult to accurately calculate the remaining life even after the appearance of the deterioration.

In the technology disclosed in Japanese Unexamined Patent Publication (Kokai) No. 2012-15440, while nearing the end can be known, it is difficult to know the quantitative remaining life of the laser apparatus.

Further, in Japanese Unexamined Patent Publication (Kokai) No. 2005-317841, the "driving current time product" is used. However, the life may not be 1/n even when the driving current is larger by n times. Therefore, the technology disclosed in Japanese Unexamined Patent Publication (Kokai) No. 2005-317841 cannot accurately calculate an effective driving time, disabling a quantitative remaining life to be known.

When the LD is driven on a driving condition that an optical output, a driving current, or a LD temperature is a certain predetermined standard value, in other words, on a standard driving condition, a whole life of the LD can be approximately known. It is also generally known that how much the average whole life is shortened by how many times the optical output or the LD driving current is larger than the standard driving condition. In addition, it is generally known that how much the average whole life is shortened by how much the temperature of the LD is increased with respect to the standard driving condition.

However, in the case of LDs substantially identical in performance, when the LDs reach life ends first after driving of 30000 hours at 13 A and then after driving of 50000 hours at 10 A, it is yet to be determined whether the LDs reach life ends first after driving of 50000 hours at 10 A and then after driving of 30000 hours at 13 A.

In actuality, there is a high possibility that the life of the LD will come to its end within 30000 hours when the latter LD is driven at 13 A after driving of 50000 hours at 10 A. For example, it is assumed that an average whole life at a driving current of 10 A is 100000 hours and an average whole life at a driving current of 13 A is 50000 hours. In this case, the whole life at the driving current of 13 A is not reduced at a speed twice as fast as that of the whole life at the driving current of 10 A. In reality, the shorter the remaining life, the faster a deterioration speed of the LD, and thus a reduction speed of the remaining life of the LD may be faster.

In other words, the reduction speed of the remaining life in the initial period of the life when the LD is driven at 13 A is lower than a double speed of that when the LD is driven at 10 A. The reduction speed of the remaining life in the late period of the life when the LD is driven at 13 A is higher than the double speed of that when the LD is driven at 10 A. Accordingly, in the overall whole life, there is a difference of a double length between when the LD is driven at 13 A and when the LD is driven at 10 A. Therefore, it can be determined that the whole life is shorter when the LD is driven at 13 A after driving of 50000 hours at 10 A at first than when the LD is driven at 10 A after driving of 30000 hours at 13 A at first.

An acceleration rate of the remaining life reduction based on such an increase of the driving current may be affected not by a simple function of the driving current but by a state of the laser apparatus such as a LD temperature and humidity around the LD, and history of the LD driving conditions thus far.

As described above, when the LD is driven on a certain driving condition, the LD driving history thus far and the associated conditions such as the state of the LD during driving may affect the remaining life of the LD. It is therefore difficult to accurately know the remaining life of the LD. As a result, when an optical output is to be obtained as instructed at a plurality of LDs in response to a certain optical output command, to achieve the longest life as a whole, it is preferred to solve a problem that how driving currents are allocated to the respective LDs cannot be accurately determined. Even in the aforementioned conventional technologies, the accurate remaining life of the LD cannot be derived.

In order to always derive the accurate remaining life when the driving condition of the LD variously changes, a human operator preferably checks the influence of the LD driving history or the laser state on the remaining life of the LD by repeating trial and error for prediction of the remaining life while variously allocating the LD driving history or the laser state. Even when such a process of trial and error is performed, whether an estimate of the remaining life is correct cannot be conformed until the life end.

When estimate accuracy of the remaining life at the life end is improved, whether an estimate of the remaining life at a point of time before the life end is correct can be determined. Therefore, to enable accurate estimation of even the remaining life in the initial period of the life, an enormous volume of data may be piled up, and it is extremely difficult and takes time to extract a method for predicting the remaining life from the enormous volume of data.

The present invention has been made with the foregoing situation in mind, and provides, in order to enable prediction of a reduction amount of a remaining life of an LDU caused by driving of the LD, a machine learning apparatus, a laser apparatus, and a machine learning method that can learn LDU driving condition data including a prediction result of a remaining life of each LDU without any human intervention.

In order to achieve the object, according to a first aspect of the present invention, there is provided a machine learning apparatus for a laser apparatus that is provided with: a plurality of LD units including at least one or more laser diode modules; a power source unit that individually supplies a driving current to each LD unit; and a control unit that independently controls, for each LD unit, the driving current injected from the power source unit to each LD unit, and emits a laser light via a laser optical system by using a laser light from the plurality of LD units as a laser light source or as an excitation light source for laser oscillation, the machine learning apparatus being configured to learn LD unit driving condition data including output command data instructed to the power source unit. The machine learning apparatus includes: a state amount observation unit that observes a state amount of the laser apparatus including output data from the power source unit, at least one or more optical output detection units that measure an optical output of the laser light, an optical output characteristic recording unit that records history of a measurement result of optical output characteristics of each LD unit obtained from the driving current output from the power source unit and the optical output, and a driving condition/state amount recording unit configured to record history of the LD unit driving condition data including at least a prediction result of a remaining life of each LD unit as a prediction result of characteristics of each LD unit output from the machine learning apparatus and history of the state amount of the laser apparatus; an operation result acquisition unit that acquires, as results of the LD unit driving condition data, the prediction result of the characteristics of each LD unit including at least the prediction result of the remaining life of each LD unit recorded in the driving condition/state amount recording unit and the measurement result of the optical output characteristics of each LD unit; a learning unit that receives an output from the state amount observation unit and an output from the operation result acquisition unit, and learns the LD unit driving condition data including at least the prediction result of the remaining life as the prediction result of the characteristics of each LD unit in association with the state amount of the laser apparatus and the results of the LD unit driving condition data; and a decision-making unit that decides, by referring to a learning result of the learning unit, the LD unit driving condition data including at least the prediction result of the remaining life as the prediction result of the characteristics of each LD unit.

According to a second aspect of the present invention, in the machine learning apparatus according to the first aspect, a prediction result of the optical output characteristics of each LD unit is also included as a prediction result of the characteristics of each LD unit in the LD unit driving condition data output from the machine learning apparatus to be recorded in the driving condition/state amount recording unit, the prediction result of the optical output characteristics of each LD unit is included in data acquired by the operation result acquisition unit as the result of the LD unit driving condition data, and the learning unit learns the LD unit driving condition data including at least the prediction result of the remaining life and the prediction result of the optical output characteristics as the prediction results of the characteristics of each LD unit in association with the state amount of the laser apparatus and the results of the LD unit driving condition data.

According to a third aspect of the present invention, in the machine learning apparatus according to the first or second aspect, the learning unit has a function for estimating, on the basis of optical output characteristics of each LD unit at given time, history of optical output characteristics of each LD unit recorded in the optical output characteristic recording unit up to the given time, and history of the LD unit driving condition data and history of the state amount of the laser apparatus recorded in the driving condition/state amount recording unit up to the given time, a remaining life of each LD unit at the given time by referring to the learning result of the LD unit driving condition data including at least the prediction result of the remaining life as the prediction result of the characteristics of each LD unit.

According to a fourth aspect of the present invention, in the machine learning apparatus according to any one of the first to third aspects, at least one of output data from at least one or more temperature detection units that detect a temperature of at least one of each LD unit and a member thermally connected to each LD unit, output data from a refrigerant temperature detection unit that detects a temperature of a refrigerant for cooling each LD unit, output data from an environmental temperature detection unit that detects an environmental temperature of each LD unit, output data from a flow rate detection unit that detects a flow rate of the refrigerant, and output data from a humidity detector that detects environmental humidity of each LD unit is included in the state amount of the laser apparatus input to the state observation unit.

According to a fifth aspect of the present invention, in the machine learning apparatus according to any one of the first to fourth aspects, the learning unit has a value function for defining a value of the LD unit driving condition data including at least the prediction result of the remaining life as the prediction result of the characteristics of each LD unit. The machine learning apparatus further includes a reward calculation unit. The reward calculation unit is configured to: provide a plus reward according to a difference or a ratio when the difference between a prediction result at second time predicted with an estimation result at first time set as a starting point in a remaining life of each LD unit predicted or estimated as a result of the LD unit driving condition data instructed to each LD unit from the first time to the second time after the first time and recorded in the driving condition/state amount recording unit and an estimation result at the second time is smaller than a predetermined value or a predetermined ratio; provide a minus reward according to the difference or a size of the ratio when the difference between the prediction result and the estimation result of the remaining life is larger than the predetermined value or the predetermined ratio; when the LD unit driving condition data includes the prediction result of the optical output characteristics as the prediction result of the characteristics of each LD unit, provide a plus reward according to a difference or a ratio when the difference between a prediction result at the second time predicted with a measurement result at the first time set as a starting point in optical output characteristics of each LD unit obtained as a result of the LD unit driving condition data instructed to each LD unit from the first time to the second time and recorded in the driving condition/state amount recording unit and a measurement result at the second time is smaller than a predetermined value or a predetermined ratio; and provide a minus reward according to the difference or the ratio when the difference between the prediction result and the measurement result of the optical output characteristics is larger than the predetermined value or the predetermined ratio. The machine learning apparatus further includes a value function update unit that updates the value function according to the reward.

According to a sixth aspect of the present invention, in the machine learning apparatus according to any one of the first to fourth aspects, the learning unit has a learning model for learning the LD unit driving condition data including at least the prediction result of the remaining life as the prediction result of the characteristics of each LD unit. The machine learning apparatus further includes an error calculation unit. The error calculation unit is configured to: calculate a difference between a prediction result at second time predicted with an estimation result at first time set as a starting point in a remaining life of each LD unit predicted or estimated as a result of the LD unit driving condition data instructed to each LD unit from the first time to the second time and recorded in the driving condition/state amount recording unit and an estimation result at the second time; and when the LD unit driving condition data includes the prediction result of the optical output characteristics as the prediction result of the characteristics of each LD unit, calculate a difference between a prediction result at the second time predicted with a measurement result at the first time set as a starting point in optical output characteristics of each LD unit obtained as a result of the LD unit driving condition data instructed to each LD unit from the first time to the second time and recorded in the driving condition/ state amount recording unit and a measurement result at the second time. The machine learning apparatus further includes a learning model update unit that updates the learning model according to the difference calculated by the error calculation unit.

According to a seventh aspect of the present invention, there is provided a laser apparatus provided with the machine learning apparatus according to any one of the first to sixth aspect. The laser apparatus includes a control unit that controls each of the power source unit configured to supply a driving current to each of the LD units, the laser optical system, the optical output detection unit, the optical output characteristic recording unit, and the driving condition/state amount recording unit.

According to an eighth aspect of the present invention, in the laser apparatus according to the seventh aspect, in response to a command from the control unit, a relationship between an applied voltage and an optical output with respect to the driving current of each LD unit is individually measured along a predetermined schedule to add, in the optical output characteristic recording unit, optical output characteristics of each LD unit of measurement time.

According to a ninth aspect of the present invention, the laser apparatus according to the seventh or eighth aspect further includes a plurality of optical output detection units to simultaneously measure the optical output characteristics of the plurality of LD units.

According to a tenth aspect of the present invention, in the laser apparatus according to any one of the seventh to ninth aspects, the learning unit is configured to: add, as a result of the LD unit driving condition data including at least the prediction result of the remaining life as the prediction results of the characteristics of each LD unit, an estimated remaining life of each LD unit estimated by referring to a learning result to the driving condition/state amount recording unit; and output or display, with time obtained by subtracting an estimated remaining life at fourth time after third time from an estimated remaining life at the third time set as effective driving time of each LD unit which is converted from actual driving time of each LD unit from the third time to the fourth time into driving time on a standard driving condition, the estimated remaining life of each LD unit at the fourth time as a remaining life of each LD unit at the fourth time.

According to an eleventh aspect of the present invention, in the laser apparatus according to any one of the seventh to tenth aspects, in response to an optical output command to the laser apparatus, through reference to the learning result via the learning unit, the decision-making unit that outputs the LD unit driving condition data including the prediction results of the remaining life and the optical output characteristics of each LD unit sets a condition for selecting at least one of four driving condition modes or a condition for switching a driving condition mode among the driving condition modes, the four driving condition modes being: a life top priority mode for outputting LD unit driving condition data where a total reduction amount of remaining lives of the LD units by driving of the LD units is predicted to be a minimum value; an efficiency priority mode for outputting LD unit driving condition data where photoelectric conversion efficiency of the laser apparatus as a whole is roughly maximum efficiency within a condition range where a total reduction amount of the remaining lives of the LD units is predicted to be a predetermined multiple or lower of the minimum value; a life priority mode for outputting LD unit driving condition data where a total reduction amount of the remaining lives of the LD units is predicted to be a minimum value within a condition range where the photoelectric conversion efficiency of the laser apparatus as a whole is a predetermined reduction rate or lower from the maximum efficiency; and a simultaneous exchanging mode for outputting LD unit driving condition data where a reduction rate of the remaining life of each LD unit is predicted to be proportional to the remaining life of each LD unit.

According to a twelfth aspect of the present invention, in the laser apparatus according to any one of the seventh to eleventh aspects, in response to an optical output command to the laser apparatus, the control unit reads the LD unit driving condition data output from the decision-making unit and recorded in the driving condition/state amount recording unit, and outputs the LD unit driving condition data including output command data instructed to the power source unit to the power source unit, the laser optical system, the optical output detection unit, and the optical output characteristic recording unit.

According to a thirteenth aspect of the present invention, in the laser apparatus according to any one of the seventh to twelfth aspects, a plurality of laser apparatuses each of which corresponds to the laser apparatus are present, and a plurality of machine learning apparatuses each of which corresponds to the machine learning apparatus and which are installed in the respective laser apparatuses share or exchange data with each other via a communication medium.

According to a fourteenth aspect of the present invention, in the laser apparatus according to the thirteenth aspect, the machine learning apparatus is shared by the plurality of laser apparatuses via the communication medium.

According to a fifteenth aspect of the present invention, there is provided a machine learning method for learning LD unit driving condition data including output command data instructed to a power source unit and at least a prediction result of a remaining life as a prediction result of characteristics of each LD unit. The method includes: observing a state amount of a laser apparatus including output data from the power source unit, at least one or more optical output detection units that measure an optical output, an optical output characteristic recording unit that records history of a measurement result of optical output characteristics of each LD unit obtained from the driving current output from the power source unit and the optical output, and a driving condition/state amount recording unit that records history of the LD unit driving condition data including at least a prediction result of a remaining life of each LD unit as a prediction result of characteristics of each LD unit output from a machine learning apparatus and history of the state amount of the laser apparatus; receiving, as results of the LD unit driving condition data, the prediction result of the characteristics of each LD unit including at least the prediction result of the remaining life of each LD unit recorded in the driving condition/state amount recording unit and the measurement result of the optical output characteristics of each LD unit; and learning the LD unit driving condition data including the output command data instructed to the power source unit and at least the prediction result of the remaining life as the prediction result of the characteristics of each LD unit in association with the state amount of the laser apparatus and the results of the LD unit driving condition data.

According to a sixteenth aspect of the present invention, in the machine learning method according to the fifteenth aspect, a prediction result of the optical output characteristics of each LD unit is also included as a prediction result of the characteristics of each LD unit in the LD unit driving condition data output from the machine learning apparatus to be recorded in the driving condition/state amount recording unit, the prediction result of the optical output characteristics of each LD unit is included in data acquired by an operation result acquisition unit as the result of the LD unit driving condition data, and a learning unit learns the LD unit driving condition data including at least the prediction result of the remaining life and the prediction result of the optical output characteristics as the prediction results of the characteristics of each LD unit in association with the state amount of the laser apparatus and the results of the LD unit driving condition data.

BRIEF DESCRIPTION OF THE DRAWINGS

These objects, features and advantages, and other objects, features and advantages of the present invention will be more clearly understood from the following detailed description of the exemplary embodiments of the invention in conjunction with the accompanying drawings, in which:

FIG. 7B is a second flow chart illustrating an example of the operation of the machine learning apparatus illustrated in FIG. 1;

FIG. 9A is a first flow chart illustrating an example of an operation of a machine learning apparatus illustrated in FIG. 8;

DETAILED DESCRIPTION

Figure 1:
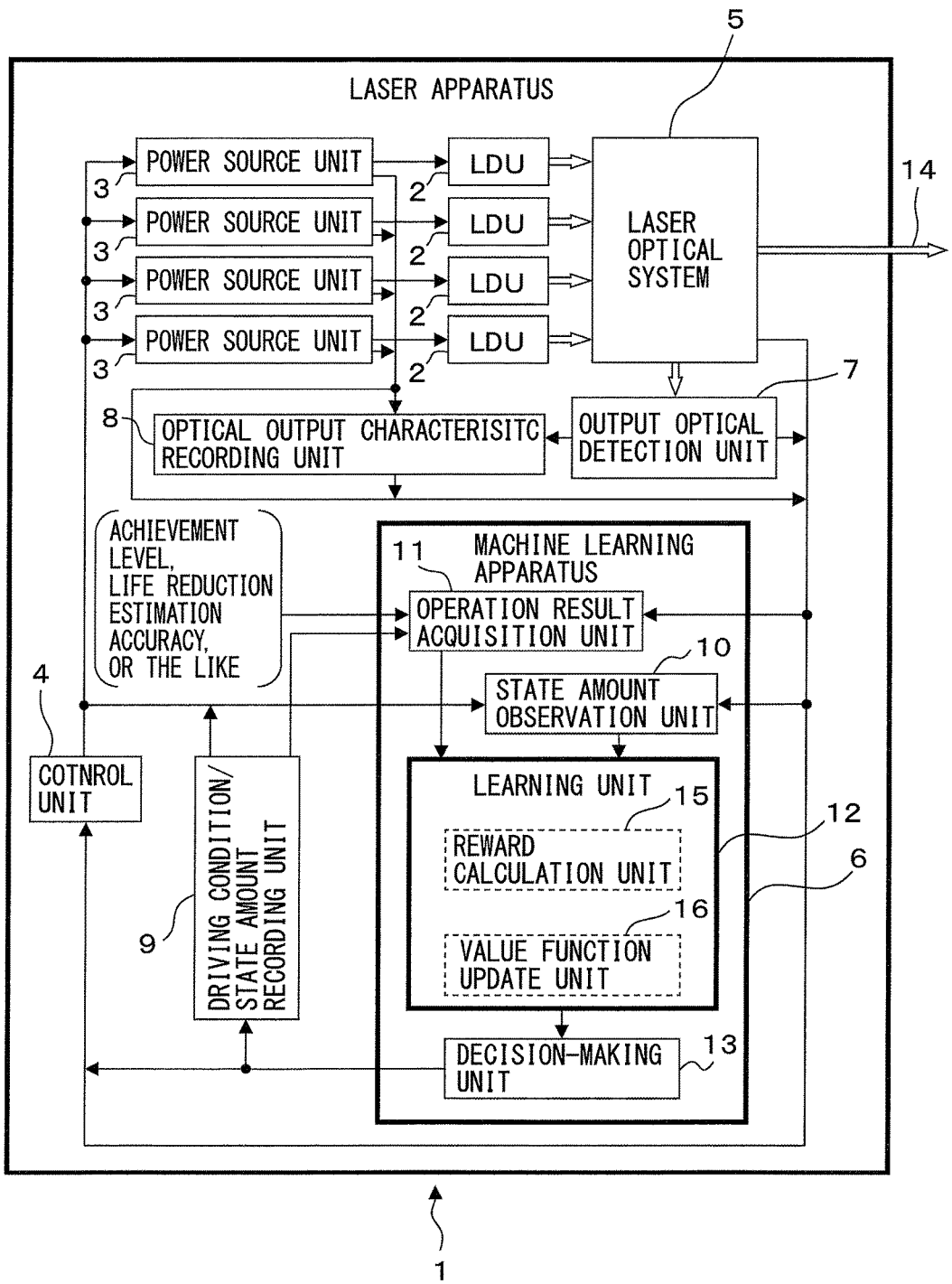
FIG. 1 is a block diagram illustrating a conceptual configuration of a laser apparatus according to an embodiment of the present invention.

Hereinafter, the embodiments of the present invention will be described with reference to the accompanying drawings. Throughout the drawings below, similar members are assigned similar reference numerals. For easier understanding, the drawings are appropriately changed in reduction scale.

FIG. 1 is a block diagram illustrating a conceptual configuration of a laser apparatus 1 according to an embodiment of the present invention. The laser apparatus 1 according to the present embodiment is provided with: a plurality of laser diode module units 2 (LDU, LD unit) that include at least one or more laser diode modules (LDM); power source units 3 that can individually supply driving currents to the respective LDUs 2; a control unit 4 that can independently control, for each LDU 2, the driving current injected from the power source unit 3 to each LDU 2; a laser optical system 5 that emits, from the laser apparatus 1, a laser light 14 from the plurality of LDUs 2 as a laser light source or an excitation light source for laser oscillation; an optical output detection unit 7 that measures an optical output of the laser light 14; an optical output characteristic recording unit 8 that records history of a measurement result of optical output characteristics of each LDU 2 obtained from the driving current output from the power source unit 3 and the optical output; a driving condition/state amount recording unit 9 that records history of output command data for instructing each power source unit 3 and LDU driving condition data including at least a prediction result of a remaining life as a prediction result of characteristics of each LDU 2 and history of a state amount of the laser apparatus 1; and a machine learning apparatus 6. The machine learning apparatus 6 includes a state observation unit 10, an operation result acquisition unit 11, a learning unit 12, and a decision-making unit 13.

The machine learning apparatus 6 receives an output from the state amount observation unit that observes the state amount of the laser apparatus 1 including output data from the optical output characteristic recording unit 8 and the driving condition/state amount recording unit 9, and an output from the operation result acquisition unit 11 that acquires the prediction result of characteristics of the LDU 2 including at least the prediction result of the remaining life as the prediction result of characteristics of each LDU 2 recorded in the driving condition/state amount recording unit 9 and a measurement result of the optical output characteristics of each LDU 2 as a result of LDU driving condition data. The learning unit 12 learns the LDU driving condition data including at least the prediction result of the remaining life as a prediction result of characteristics of each LDU 2 in association with the state amount of the laser apparatus 1 and the result of the LDU driving condition data. The decision-making unit 13 decides and outputs, by referring to a learning result of the learning unit 12, output command data for instructing each power unit 3 and LDU driving condition data including at least the prediction result of the remaining life as the prediction result of characteristics of each LDU 2.

When each LDU 2 is driven while changing a driving condition, how much a remaining life is reduced cannot be accurately known due to the influence of history of driving conditions. For example, it has been impossible to accurately know a condition for allocating driving currents to the respective LUDs 2 where a total reduction amount of remaining lives of the LUDs 2 is minimized. However, by learning, through LDU driving under various conditions where history of driving conditions of the LDU 2 and history of optical output characteristics are different, the LDU driving condition data including at least the prediction result of the remaining life as the prediction result of characteristics of each LDU 2 in association with the state amount of the laser apparatus 1 and the result of the LDU driving condition data, prediction accuracy of the remaining life of the LDU 2 can be improved, enabling the LUD 2 to be driven under an optimal driving condition accurately predicting a change in remaining life even for the LDU 2 driven under various driving conditions.

The LDU driving condition data output from the machine learning apparatus 6 and recorded in the driving condition/state amount recording unit 9 also includes a prediction result of optical output characteristics of each LDU 2 as a prediction result of characteristics of each LDU 2, and the data acquired as the result of the LDU driving condition data by the operation result acquisition unit 11 includes a prediction result of light output characteristics of each LDU 2. The learning unit 12 can also learn the LDU driving condition data including at least the prediction result of the remaining life and the prediction result of optical output characteristics as the prediction results of characteristics of each LDU 2 in association with the state amount of the laser apparatus 1 and the result of the LDU driving condition data. The optical output characteristics can always be measured accurately, and prediction accuracy can be verified. A life comes to an end when a predetermined optical output cannot be obtained any more at a predetermined driving current, and remaining life=0 time is set. Accordingly, the optical output characteristics have a close relationship with a remaining life. On the other hand, for the remaining life, at least in the initial learning period, except for at the life end, it is difficult to verify whether a prediction result of the remaining life is correct. Therefore, it is preferred to improve, by including the prediction result of the optical output characteristics in the prediction result of characteristics of the LDU 2, prediction accuracy of the optical output characteristics of the LDU 2, thereby improving prediction accuracy of the remaining life of the LDU 2.

Figure 2:
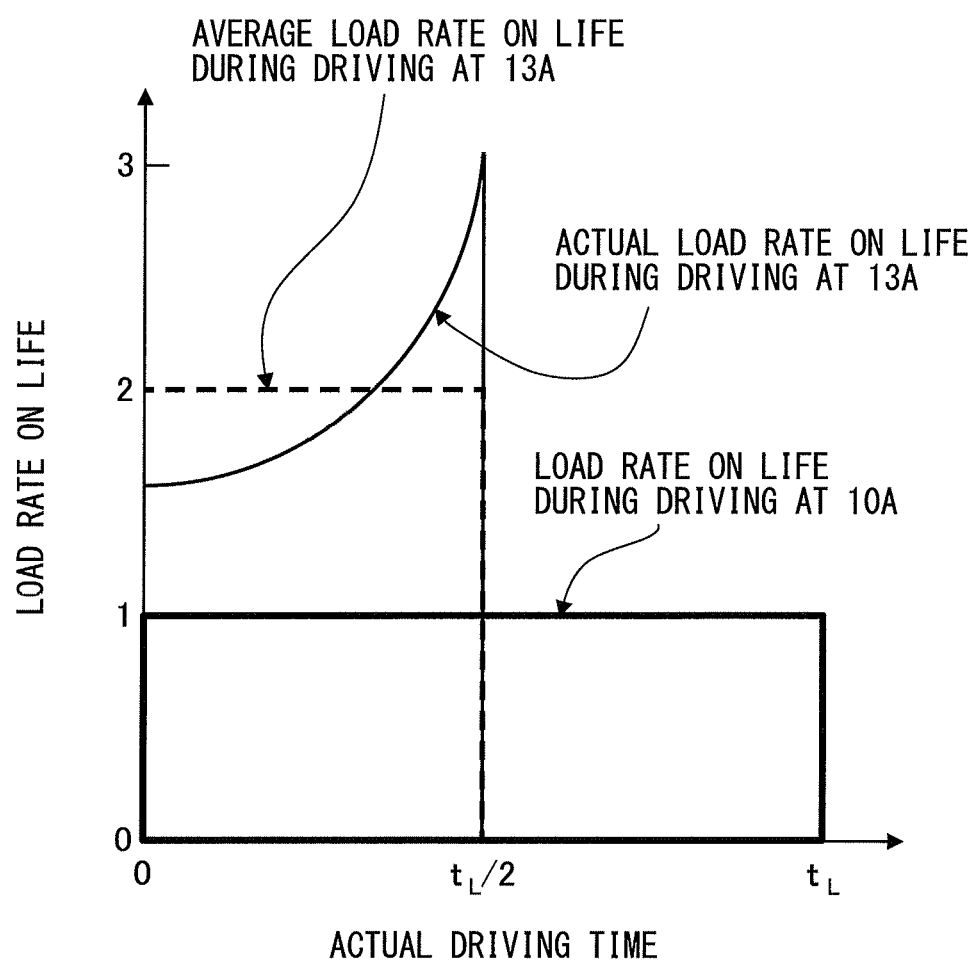
FIG. 2 is a graph illustrating a relationship between an actual driving time and a load rate on a life.

What learning result will be obtained for the remaining life is not entirely unknown. When a driving current is different from a standard driving condition of the LDU 2, as a result of learning, a learning result illustrated in FIG. 2 may be obtained. In FIG. 2, a horizontal axis indicates an actual driving time of the LDU 2, while a vertical axis indicates a load rate on a life. Assuming that a standard driving current is 10 A, a whole life during driving at 10 A is indicated by $t_L$, and a whole life during continuous driving at 13 A is indicated by $t_L/2$, an average load rate on the life during driving at 13 A is larger by twice. However, unlike the average load rate indicated by a dotted-line, an actual load rate on the life during driving at 13 A qualitatively has a shape similar to a curve, and with the lapse of effective cumulative driving time, as deterioration progresses, the load rate on the life may be higher. Effective cumulative driving time obtained by integrating the actual load rate on the life during driving at 13 A by time 0 to $t_L/2$ may be $t_L$. However, in view of an average load rate on the life when the driving current is increased, there is a possibility not only that the effective cumulative driving time will be overestimated and a remaining life will be underestimated in the middle of the life but also that an increase of a load rate on the life will be underestimated to reduce a remaining life of a specific LDU 2 more than predicted in a late life period. Thus, while the curve in FIG. 2 is only conceptually illustrated, a correct relationship is obtained by machine learning. Only the case where the driving current is 13 A with respect to the standard driving current of 10 A has been described. Similarly, a correct relationship is preferably obtained not only for other driving currents but also for a case where a temperature or the like of the LDU 2 is different as described below. Accordingly, to predict a whole remaining life of the LDU 2 driven under various conditions, an enormous volume of data may be provided, and thus it is still significant to carry out learning without any human intervention.

When there is a setting condition (or constraint condition) concerning driving of each LDU 2, the decision-making unit 13 decides and outputs LDU driving condition data matching not only an optical output command to the laser apparatus 1 but also the setting condition. For example, when there is set a condition for driving the LDU 2 so as to minimize a total reduction amount of remaining lives of the LDUs 2, the decision-making unit 13 decides and outputs, so as to minimize the total reduction amount of remaining lives of the LDUs 2 predicted by referring to the learning result of the learning unit 12, LDU driving condition data allocating driving currents to the LDUs 2. The remaining life of the LDU 2 can be predicted by referring to a learning result obtained by learning the LDU driving condition data including at least the prediction result of the remaining life as the prediction result of characteristics of each LDU 2 so that an error of the prediction result becomes small. A specific learning method will be described below. Basic information of the laser apparatus 1 such as an allowable optical output range of each LDU 2 and a relationship between an output from the optical output detection unit and an optical output from the laser apparatus 1 is preferably stored in advance from the control unit 4 or the like in the state observation unit 10 or the like of the machine learning apparatus 6.

The laser light 14 emitted based on the LDU driving condition data may have a waveform of a pulse light, a waveform of a CW light, or a waveform where a pulse light is superimposed on a CW light, and thus there is no limitation on output waveforms.

As the laser apparatus 1 that directly uses the laser light 14 from the plurality of LDUs 2 as a laser light source, there is a direct diode laser apparatus or the like. As the laser apparatus 1 that uses the laser light 14 from the plurality of LDUs 2 as an excitation light source, there is a fiber laser apparatus or the like. However, the laser apparatus 1 is not limited to these apparatuses.

In FIG. 1, a void arrow schematically indicates a beam of the laser light 14. However, not limited to a beam propagated through a space, the beam including, for example, a beam propagated through an optical fiber, is schematically illustrated. Similarly, the laser light 14 output from the laser apparatus 1 is schematically illustrated in the sense including a structure provided with a processing head configured such that the laser light 14 is propagated through the optical fiber to be focused roughly on a surface of an object to be processed at a tail end of the optical fiber.

In FIG. 1, a light is schematically illustrated to have entered the optical output detection unit from the laser optical system 5. However, when the light is propagated through the space, for example, the light can be branched by a half mirror to detect a part of the light. When the light is propagated through the optical fiber, for example, the branched light from the tail end of the optical fiber can be detected by using an optical divider, or leaking light can be detected from a clad of the optical fiber. Thus, an entry structure of the light to the optical output detection unit is not limited to the structure illustrated in FIG. 1.

The number of LDUs 2 is not limited to four illustrated in FIG. 1, but any number may bet set as long as a plurality of units is provided.

Further, in FIG. 1, the laser optical system 5 is illustrated to be present only in the laser apparatus 1. However, for example, the laser optical system 5 is schematically illustrated in the sense including an optical system of a processing head installed at the tail end of the optical fiber laid outside the laser apparatus 1 in an extending state. This laser optical system 5 is utilized, for example, for enabling the laser light 14 output from the laser apparatus 1 to be focused roughly on a surface of the object to be processed. Accordingly, the laser optical system 5 functions for optical coupling, light condensing, focusing or the like for this purpose. In the laser apparatus 1 that uses the laser light 14 from the LDU 2 as the excitation light source, an excitation medium is included. In addition, the laser optical system 5 is preferably configured to control a focal position from the surface of the object to be processed or the like by the control unit 4.

In FIG. 1, to facilitate understanding of the drawing, a control signal line from the control unit 4 to the respective units, namely, the laser optical system 5, the optical output detection unit 7, the optical output characteristic recording unit 8, and the driving condition/state amount recording unit 9, and a state transmission line from each unit to the control unit 4 are omitted.

The state amount observation unit 10 and the operation result acquisition unit 11 are functional blocks, and both functions may be achieved by one block. Similarly, the optical output characteristic recording unit 8 and the driving condition/state amount recording unit 9 are functional blocks, and both functions may be achieved by one block.

In addition, with regard to the optical output characteristic recording unit 8 and the driving condition/state amount recording unit 9, one or more thereof may be provided in the machine learning apparatus 6, or all may be provided in the machine learning apparatus 6.

Figure 3:
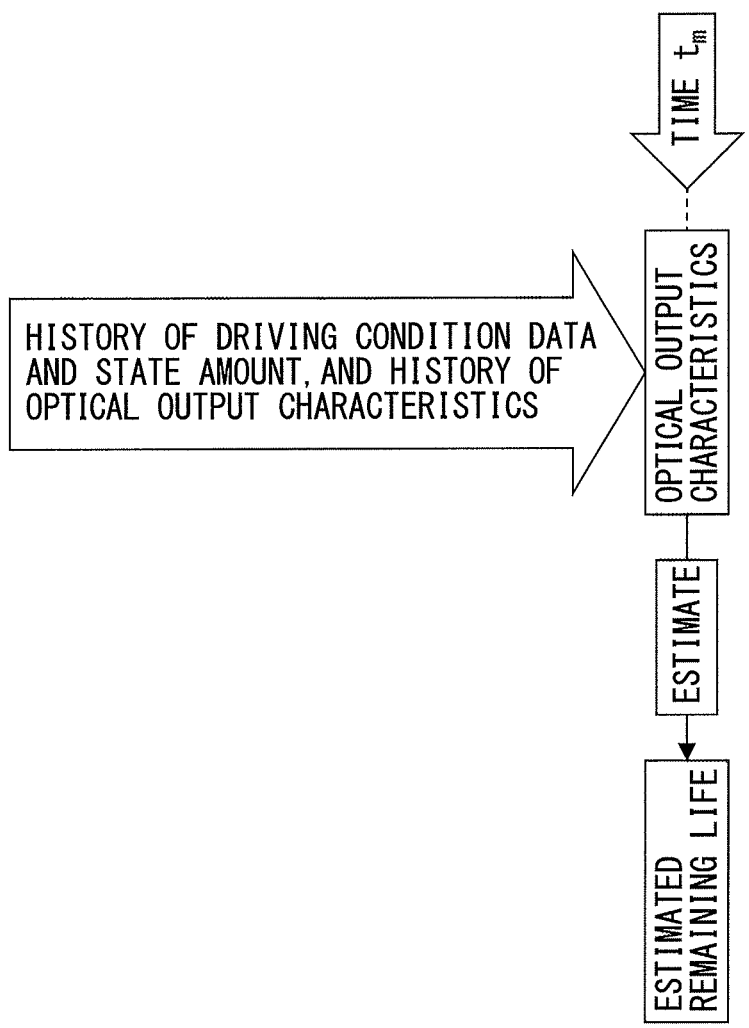
FIG. 3 is a block diagram schematically illustrating a flow of data.

As the flow of data is schematically illustrated in the block diagram of FIG. 3, the learning unit 12 preferably has a function for estimating, at a time $t_m$ of measuring optical output characteristics of each LDU 2, the remaining life of each LDU 2 at the time $t_m$ by referring to the learning result of the LDU driving condition data including at least the prediction result of the remaining life as the prediction result of characteristics of each LDU 2, from the optical output characteristics at the time $t_m$, history of LDU driving condition data and history of a state amount of the laser apparatus 1 up to the time $t_m$ recorded in the driving condition/state amount recording unit 9, and history of the optical output characteristics of each LDU 2 up to the time $t_m$ recorded in the optical output characteristic recording unit 8. By estimating, at a given time $t_m$, the remaining life of each LDU 2 in view of the latest data of the optical output characteristics of each LDU 2 at the time $t_m$ in addition to LDU driving condition data and the history of the state amount of the laser apparatus 1, a remaining life higher in accuracy than the previously predicted remaining life can be obtained.

The machine learning apparatus 6 can include, in the state amount of the laser apparatus 1 input to the state observation unit 10, at least one or more of output data from at least one or more temperature detection unit 17 that detects a temperature of each LDU 2 and/or a member thermally connected to each LDU 2, output data from a refrigerant temperature detection unit that detects a temperature of a refrigerant for cooling each LDU 2, output data from an environmental temperature detection unit that detects an environmental temperature of each LDU 2, output data from a flow rate detection unit that detects a flow rate of the refrigerant, and output data from a humidity detector that detects environmental humidity of each LDU 2.

Figure 4:
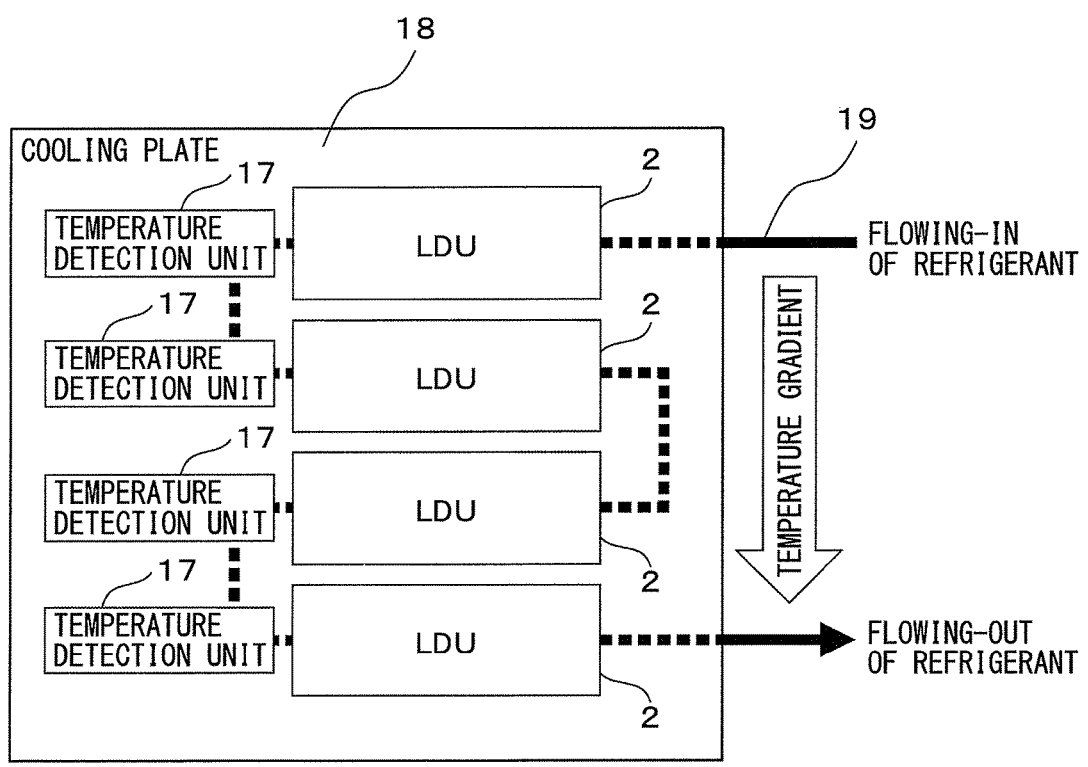
FIG. 4 is a diagram illustrating an arrangement example of a temperature detection unit.

For example, as illustrated in FIG. 4, when a refrigerant such as cooling water is supplied through piping 19 of a cooling plate 18 to which the LDU 2 is thermally connected as indicated by a thick arrow to cool the LDU 2, from a flowing-in side of the refrigerant to a flowing-out side, a refrigerant temperature increases due to heat generation of the LDU 2 to generate a temperature gradient. However, by measuring a temperature of the cooling plate 8 near each LDU 2 by the temperature detection unit 17 and employing a temperature condition of each LDU 2 as a state amount of the laser apparatus 1, changing amounts of the optical output characteristics and the remaining life can be highly accurately predicted and learned in view of a temperature condition, such as a condition that a life is short when the apparatus is driven at a high temperature. Though not illustrated in FIG. 4, when a humidity detection unit or the like is installed around the LDU 2, learning can be carried out in view of humidity around the LDU 2 that may affect a life of the LDU.

In the machine learning apparatus 6 illustrated in FIG. 1, the learning apparatus 12 can include a reward calculation unit 15, and a value function update unit 16. Specifically, as schematically illustrated in a block diagram of FIG. 5, a value function for determining a value of the LDU driving condition data including at least the prediction result of the remaining life as the prediction result of characteristics of each LDU 2 is provided, and the reward calculation unit 15 provides a plus reward according to a value of a difference or a small size of a ratio when a difference between a prediction result at a time $t_b$ predicted with an estimation result at a time $t_a$ set as a starting point in a remaining life of each LDU 2 predicted or estimated as a result of LDU driving condition data instructed to each LDU 2 from the time $t_a$ to the time $t_b$ after the time $t_a$ and recorded in the driving condition/state amount recording unit 9 and an estimation result at the time $t_b$ (in FIG. 5, a difference between a predicted remaining life and an estimated remaining life ahead of both arrows on the most right side) is smaller than a predetermined value or a predetermined ratio, further when the LDU driving condition data includes a prediction result of optical output characteristics as a prediction result of characteristics of each LDU 2, as a flow of data is schematically illustrated in a block diagram of FIG. 6, provides a plus reward according to a value of a difference or a small size of a ratio when a difference between a prediction result at the time $t_b$ predicted with a measurement result at the time $t_a$ set as a starting point in optical output characteristics of each LDU 2 obtained as a result of LDU driving condition data instructed to each LDU 2 from the time $t_a$ to the time $t_b$ and recorded in the driving condition/state amount recording unit 9 and a measurement result at the time $t_b$ (in FIG. 6, a difference between predicted optical output characteristics of upper side and measured optical output characteristics of lower side ahead of both arrows on most right side of upper side) is smaller than a predetermined value or a predetermined ratio, and provides a minus reward according to a value of a difference or a size of a ratio when a difference between a prediction result and a measurement result of optical output characteristics is larger than a predetermined value or a predetermined ratio. The value function update unit 16 updates the value function according to the reward. The value function is not limited to one type.

The learning unit 12 carries out learning so as to be able to highly accurately predict a remaining life by providing a plus reward when a difference between a prediction result and an estimation result of the remaining life is small and a minus reward when the difference between the prediction result and the estimation result of the remaining life is large. In addition, optical output characteristics having a close relationship with the remaining life can be highly accurately predicted by providing a plus reward when a difference between a prediction result and a measurement result of the optical output characteristics is small and a minus reward when the difference between the prediction result and the estimation result of the optical output characteristics is large, thereby improving prediction accuracy of the remaining life.

Figure 7A:
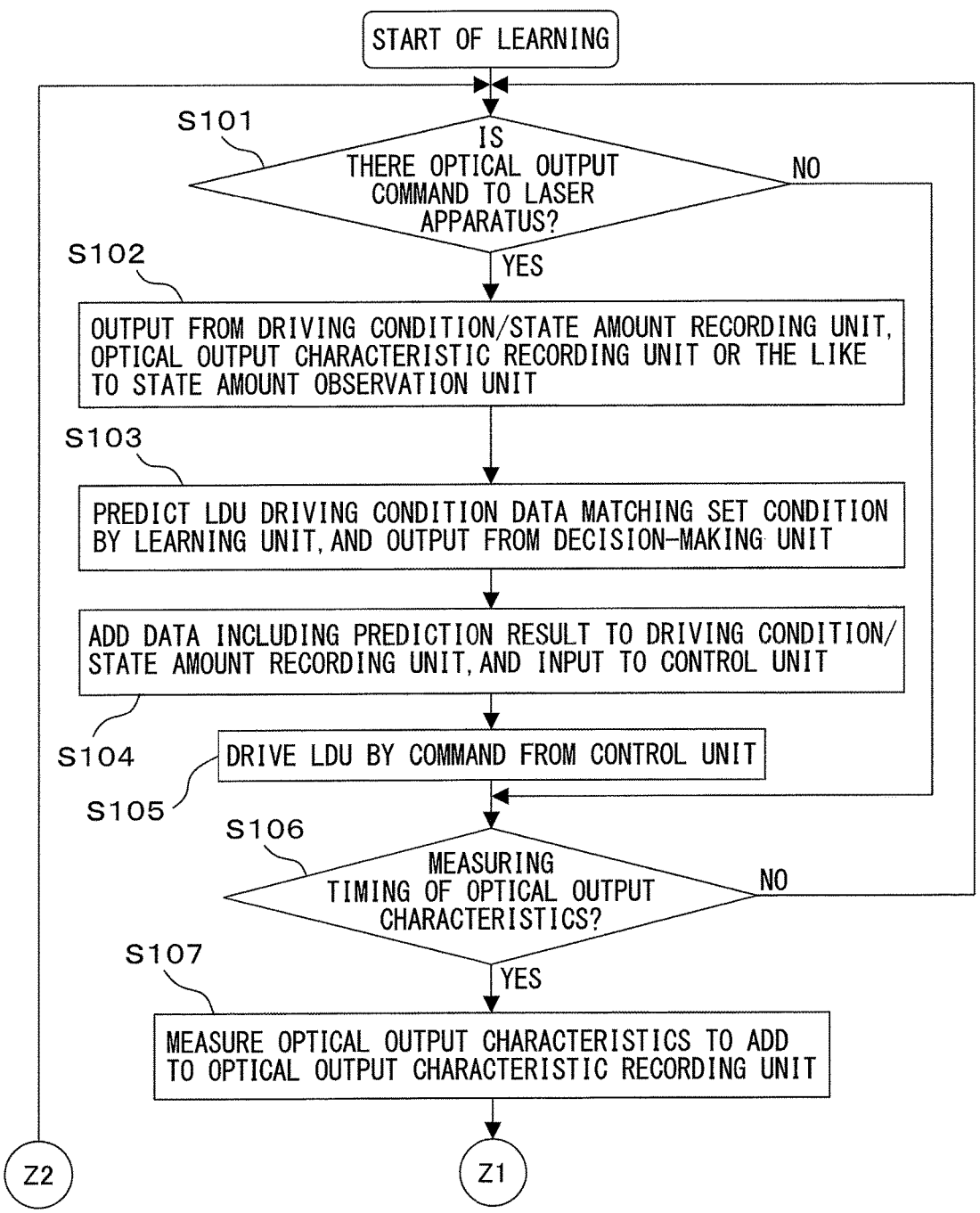
FIG. 7A is a first flow chart illustrating an example of an operation of a machine learning apparatus illustrated in FIG. 1.

Then, an example of an operation of the machine learning apparatus 6 included in the laser apparatus 1 according to the present embodiment will be described. FIGS. 7A and 7B are flow charts illustrating an example of the operation of the machine learning apparatus 6 illustrated in FIG. 1.

As illustrated in FIGS. 7A and 7B, in the machine learning apparatus 6 illustrated in FIG. 1, when a learning operation (learning process) is started, first, at step S101, whether there is an optical output command to the laser apparatus 1 is determined. When there is an optical output command to the laser apparatus 1, at step S102, the state observation unit 10 observes a state amount of the laser apparatus 1 including output data from the driving condition/state amount recording unit 9 and the optical output characteristic recording unit. At step S103, the learning unit 12 predicts, by referring to a value function reflecting a learning result, at least a change in remaining life of each LDU 2 caused by execution of LDU driving current data including an output command at the power source unit 3, and outputs LDU driving current data matching a condition set in the laser apparatus 1 and including at least a prediction result of the remaining life of each LDU 2 from the decision-making unit 13. At step S104, the LDU driving current data including at least the prediction result of the remaining life of each LDU 2 and output from the decision-making unit 13 is added to the driving condition/state amount recording unit 9, and input to the control unit 4. At step S105, the control unit 4 outputs the LDU driving current data including an output command to the power source unit 3 to the respective units of the laser apparatus 1 including the power source unit 3, and the LDU 2 is driven to emit a laser light 14 from the laser apparatus 1. At step S106, whether this point of time is a timing for measuring optical output characteristics along a predetermined schedule is determined. When it is determined in step S101 that there is no optical output command in the laser apparatus 1, the process proceeds to step S106. When it is determined in step S106 that the time is not the timing for measuring the optical output characteristics, the process returns to step S101. When it is determined in step S106 that the time is the timing for measuring the optical output characteristics, at step S107, optical output characteristics of each LDU 2 are measured from the driving current supplied from the power source unit 3 to each LDU 2 and an output from the optical output detection unit to be added to the optical output characteristic recording unit 8.

Then, at step S108, the learning unit 12 receives, from the state observation unit 10, the state amount of the laser apparatus 1 including the output data from the driving condition/state amount recording unit 9 and the optical output characteristic recording unit at the time of measuring the optical output characteristics of each LDU 2, and a measurement result of optical output characteristics of each LDU 2 and a prediction result of characteristics of each LDU 2 included in the LDU driving current data as results of the LDU driving current data from the operation result acquisition unit 11, and estimates a remaining life of each LDU 2 by referring to the value function reflecting the learning result. At step S109, a difference between the estimation result of the remaining life of each LDU 2 and the prediction result of the remaining life of each LDU 2 included in the LDU driving current data is determined. At step S110, the reward calculation unit 15 provides a plus reward according to a value of the difference or a small size of a ratio when the difference between the estimation result and the prediction result of the remaining life of each LDU 2 is smaller than a predetermined value or a predetermined ratio. At step S111, the reward calculation unit 15 provides a minus reward according to a value of the difference or a size of a ratio when the difference between the prediction result and the estimation result of the remaining life is larger than the predetermined value or the predetermined ratio. Subsequently, at step S112, whether a prediction result of optical output characteristics of each LDU 2 is also included in the LDU driving condition data is determined. When the prediction result of optical output characteristics of each LDU 2 is also included in the LDU driving condition data, then at step S113, a difference between a prediction result and a measurement result of optical output characteristics of each LDU 2 is determined. At step S114, the reward calculation unit 15 provides a plus reward according to a value of the difference or a small size of a ratio when the difference between the prediction result and the measurement result of the optical output characteristics of each LDU 2 is smaller than a predetermined value or a predetermined ratio. At step S115, the reward calculation unit 15 provides a minus reward according to a value of the difference or a size of a ratio when the difference between the prediction result and the measurement result of the optical output characteristics is larger than the predetermined value or the predetermined ratio. At step S116, the value function update unit 16 updates the value function according to the reward. Then, the process returns to step S101 to execute the flow of step S101 and after again. When it is determined in step S112 that any prediction result of optical output characteristics of each LDU 2 is not included in the LDU driving condition data, the process directly proceeds to step S116.

By repeating the above flow of steps of S101 to S116, the learning unit 12 continuously updates the value function or a behavior value table described below to carry out learning. As described above, the value function is not limited to one type.

When the life of the LDU 2 has reached its end, remaining life=0 time is set, and a target to be subjected to evaluation of a difference or an error from a prediction result of remaining time is not an estimation result of the remaining time but an actual remaining time (=0 time). Depending on a timing for measuring the optical output characteristics of the LDU 2, when it is estimated that the life has reached its end before the measurement time of optical output characteristics, an estimated remaining life may be a minus period of time.

When a change in measurement result of optical output characteristics is smaller than a measurement error or the like, per optical output characteristics of the LDU 2, without updating the value function or a learning model, the LDU driving condition data, the state amount of the laser apparatus 1, and the prediction results of the remaining life and the optical output characteristics may only be added to the driving condition/state amount recording unit 9. Then, when the change in measurement result of optical output characteristics becomes a predetermined size larger than the measurement error, a reward or an error may be calculated to update the value function or the learning model.

Machine learning has algorithms such as supervised learning, unsupervised learning, and reinforcement learning. As an action (outputting of LDU driving condition data) affects an environment (state amount of laser apparatus 1 such as remaining life of each LDU 2 or the like), the reinforcement learning where how to act is learned by observing a surrounding environment is preferably employed. Learning is carried out by obtaining a feedback in the form of affecting the environment to obtain a reward from the environment. Thus, even when a remaining life of the LDU 2 cannot be directly provided as output data, nor input data and output data appropriate for learning are provided as a pair, by utilizing a feature of the reinforcement learning, namely, the capability of selecting an action for discovering unknown learning areas and an action for utilizing known learning areas with good balance, measures enabling most rewards to be obtained through a series of actions can be learned.

For the remaining life, a range of high prediction accuracy is wider toward a direction where a life is traced back from a life end where whether prediction of the remaining life has been accurate can be verified because of an actual end of the life, through a life late period and a life middle period to a life initial period. Thus, an enormous volume of data may be provided until learning that enables highly accurate estimation over a lifetime. Therefore, pre-learning may be carried out by the supervised learning.

Figure 8:
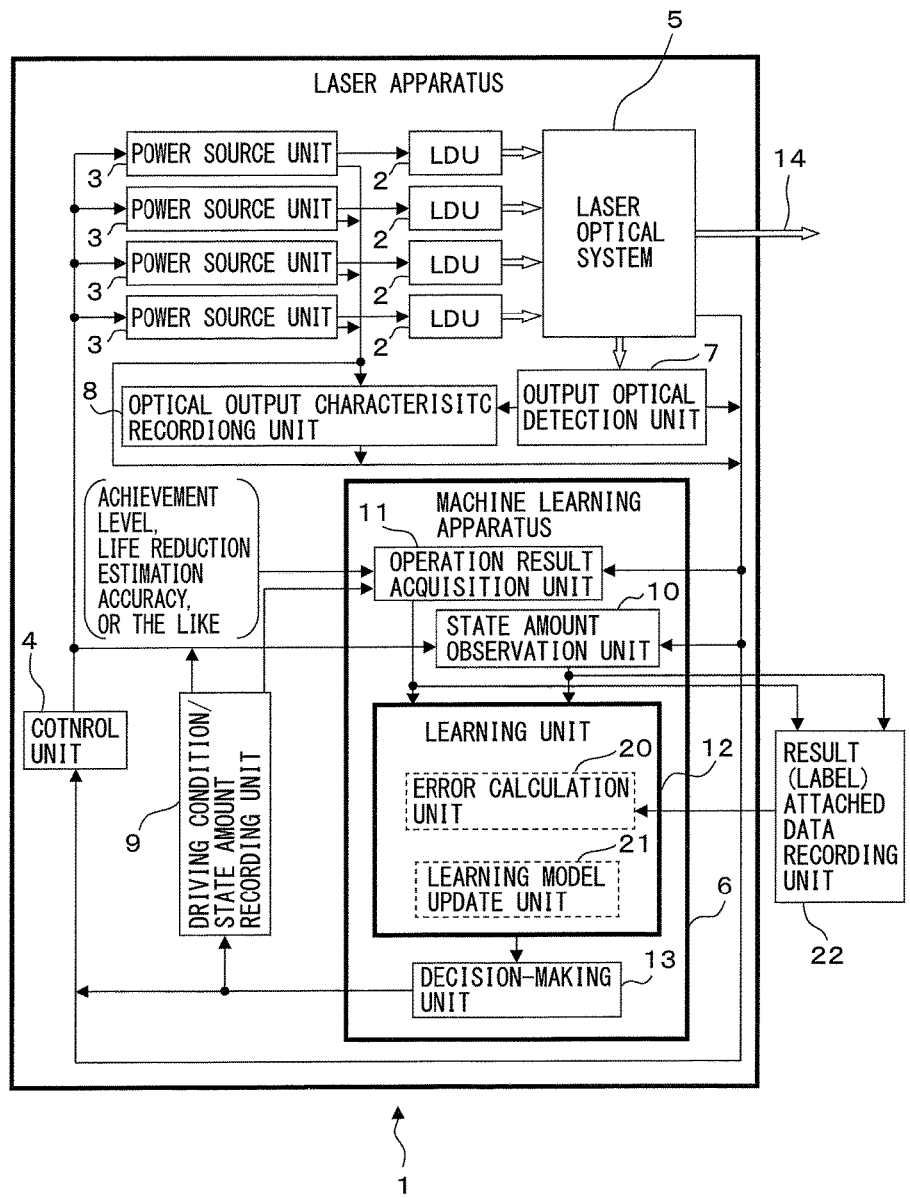
FIG. 8 is a block diagram illustrating a conceptual configuration of a laser apparatus according to another embodiment of the present invention.

In the supervised learning, as in the case of a machine learning apparatus 6 illustrated in FIG. 8, the learning apparatus 12 can include an error calculation unit 20, and a learning model update unit 21. Specifically, a learning model for learning LDU driving condition data including at least a prediction result of a remaining life as a prediction result of characteristics of each LDU 2 is provided, and the error calculation unit 20 calculates a difference between a prediction result at a time $t_b$ predicted with an estimation result at a time $t_a$ set as a starting point in a remaining life of each LDU 2 predicted or estimated as a result of LDU driving condition data instructed to each LDU 2 from the time $t_a$ to the time $t_b$ and recorded in the driving condition/state amount recording unit 9 and an estimation result at the time $t_b$ (in FIG. 5, a difference between a predicted remaining life and an estimated remaining life ahead of both arrows on the most right side), and further calculates, when the LDU driving condition data includes a prediction result of optical output characteristics as a prediction result of characteristics of each LDU 2, a difference between a prediction result at the time $t_b$ predicted with a measurement result at the time $t_a$ set as a starting point in optical output characteristics of each LDU 2 obtained as a result of LDU driving condition data instructed to each LDU 2 from the time $t_a$ to the time $t_b$ and recorded in the driving condition/state amount recording unit 9 and a measurement result at the time $t_b$ (in FIG. 6, a difference between predicted optical output characteristics of upper side and measured optical output characteristics of lower side ahead of both arrows on the most right side of upper side). The learning model update unit 21 updates the value function according to the difference.

FIG. 8 illustrates an example of a laser apparatus 1 to which the supervised learning is applied. As can be understood from the aforementioned comparison with the apparatus illustrated in FIG. 1, the supervised learning applied laser apparatus 1 illustrated in FIG. 8 further includes a result (label) attached data recording unit 22 different from the reinforcement learning applied laser apparatus 1 illustrated in FIG. 1. The machine learning apparatus 6 in the laser apparatus 1 to which the supervised learning is applied includes a state amount observation unit, an operation result acquisition unit 11, a learning unit 12, and a decision-making unit 13. The learning unit 12 includes an error calculation unit 20 and a learning model update unit 21.

The learning unit 12 carries out learning so as to be able to highly accurately predict a remaining life by calculating a difference between a prediction result and an estimation result of a remaining life and updating the learning model to reduce the difference. Further, optical output characteristics having a close relationship with the remaining life can be highly accurately predicted by calculating a difference between a prediction result and a measurement result of optical output characteristics and updating the learning model to reduce the difference, thereby improving prediction accuracy of the remaining life. By providing a pair of input data and output data appropriate for learning, the learning can proceed relatively easily.

In the reinforcement learning, learning is started from a state where a result of an action is totally unknown or known only incompletely. As described above, an enormous volume of data may be provided until learning that enables highly accurate estimation of a remaining life over a lifetime. Therefore, preferably, pre-learning is carried out by the supervised learning, and with the pre-learned state set as an initial state, the reinforcement learning is started from a start point of a good condition. In the supervised learning, a pair of input data and output data appropriate for learning is provided, and a function (learning model) for mapping input data and output data corresponding thereto is generated. The supervised learning is advantageous over the reinforcement learning in that learning is relatively easier, because the pair of input data and output data appropriate for learning is provided. In the supervised learning, preferably, as in the above case, in an initial learning period in particular, by repeating learning with simple LDU driving condition data such as a constant driving current or a constant driving current except for a difference in driving current between a first half and a second half of a whole life, a basic relationship among the LDU driving condition data, a state amount of the laser apparatus 1, and a result of the LDU driving condition data is learned, or the basic pair of input data and output data is recorded in the result (label) attached data recording unit 22 so as to smoothly progress the learning.

Figure 9B:
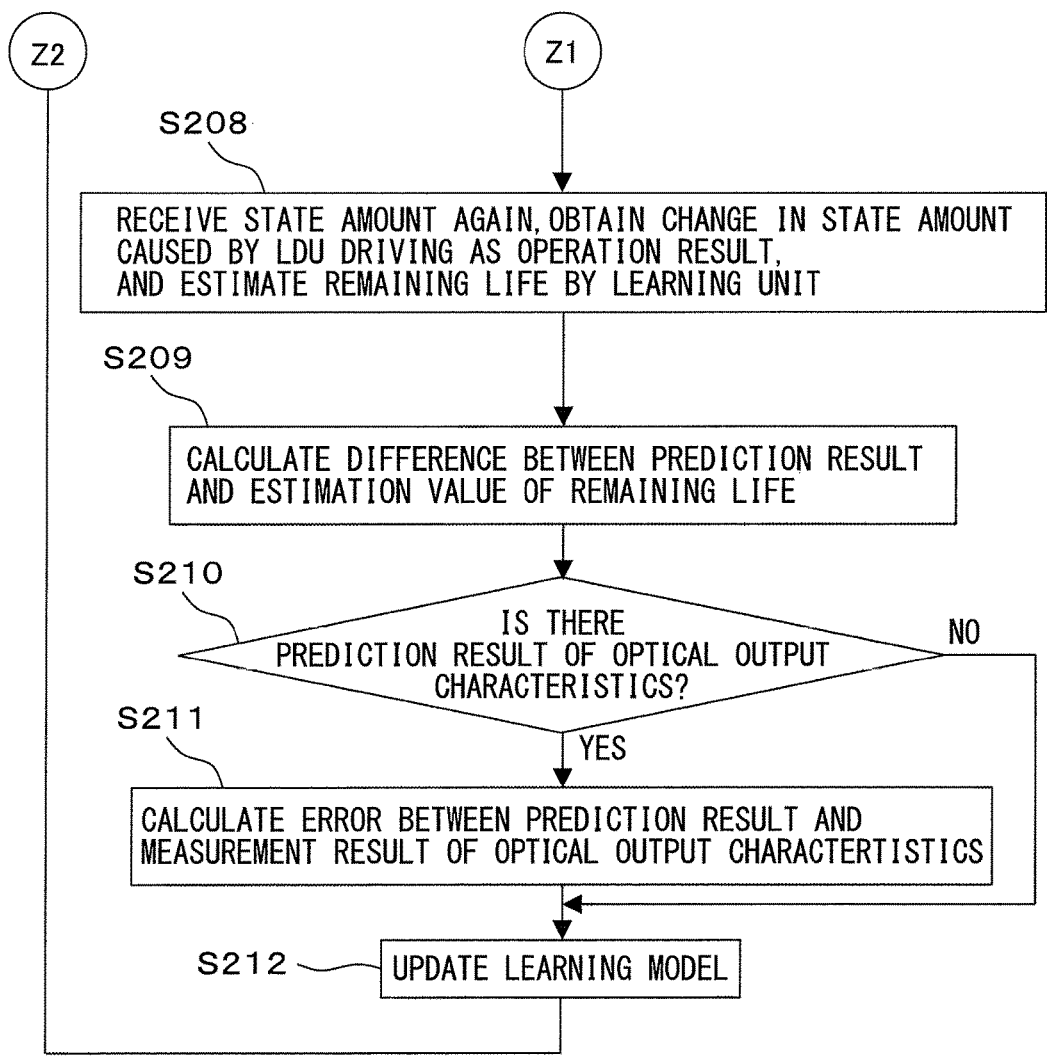
FIG. 9B is a second flow chart illustrating an example of the operation of the machine learning apparatus illustrated in FIG. 8.

FIGS. 9A and 9B are flow charts illustrating an example of an operation of the machine learning apparatus 6 illustrated in FIG. 8. As illustrated in FIGS. 9A and 9B, in the machine learning apparatus 6 illustrated in FIG. 8, when a learning operation (learning process) is started, first, at step S201, whether there is an optical output command to the laser apparatus 1 is determined. When there is an optical output command to the laser apparatus 1, at step S202, the state observation unit 10 observes a state amount of the laser apparatus 1 including output data from the driving condition/state amount recording unit 9 and the optical output characteristic recording unit. At step S203, the learning unit 12 predicts, by referring to a learning model reflecting a learning result, at least a change in remaining life of each LDU 2 caused by execution of LDU driving current data including an output command at the power source unit 3, and outputs LDU driving current data matching a condition set in the laser apparatus 1 and including at least a prediction result of the remaining life of each LDU 2 from the decision-making unit 13. At step S204, the LDU driving current data including at least the prediction result of the remaining life of each LDU 2 and output from the decision-making unit 13 is added to the driving condition/state amount recording unit 9, and input to the control unit 4. At step S205, the control unit 4 outputs the LDU driving current data including an output command to the power source unit 3 to the laser apparatus 1, and the LDU 2 is driven to emit a laser light 14 from the laser apparatus 1. At step S206, whether this point of time is a timing for measuring optical output characteristics along a predetermined schedule is determined. When it is determined in step S201 that there is no optical output command in the laser apparatus 1, the process proceeds to step S206. When it is determined in step S206 that the time is not the timing for measuring the optical output characteristics, the process returns to step S201. When it is determined in step S206 that the time is the timing for measuring the optical output characteristics, at step S207, optical output characteristics of each LDU 2 are measured from the driving current supplied from the power source unit 3 to each LDU 2 and an output from the optical output detection unit to be added to the optical output characteristic recording unit 8.

Then, at step S208, the learning unit 12 receives, from the state observation unit 10, the state amount of the laser apparatus 1 including the output data from the driving condition/state amount recording unit 9 and the optical output characteristic recording unit at the time of measuring the optical output characteristics of each LDU 2, and a measurement result of optical output characteristics of each LDU 2 and a prediction result of characteristics of each LDU 2 included in the LDU driving current data as results of the LDU driving current data from the operation result acquisition unit 11, and estimates a remaining life of each LDU 2 by referring to the learning model reflecting the learning result. At step S209, the error calculation unit 20 calculates a difference between the estimation result of the remaining life of each LDU 2 and the prediction result of the remaining life of each LDU 2 included in the LDU driving current data.

Subsequently, at step S210, whether a prediction result of optical output characteristics of each LDU 2 is also included in the LDU driving condition data is determined. When the prediction result of optical output characteristics of each LDU 2 is also included in the LDU driving condition data, then at step S211, the error calculation unit 20 calculates an error between a prediction result and a measurement result of optical output characteristics of each LDU 2. Subsequently, at step S212, the learning model update unit 21 updates the learning model according to the error. Then, the process returns to step S201 to execute the flow of step S201 and after again. When it is determined in step S210 that any prediction result of optical output characteristics of each LDU 2 is not included in the LDU driving condition data, the process directly proceeds to step S212.

By repeating the above flow of steps of S201 to S212, the learning unit 12 continuously updates the learning model to carry out learning.

Figure 5:
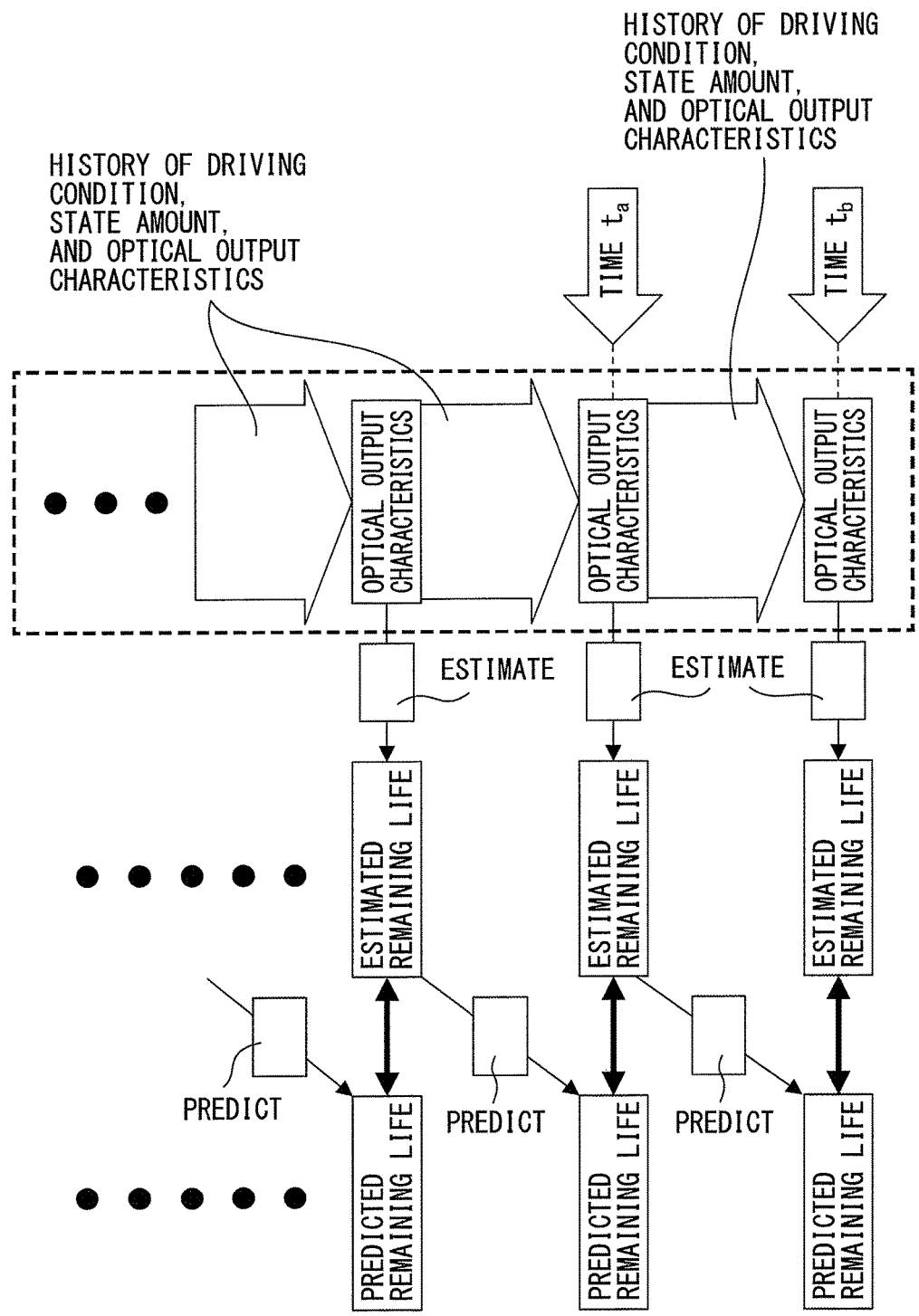
FIG. 5 is another block diagram schematically illustrating a flow of data.
Figure 6:
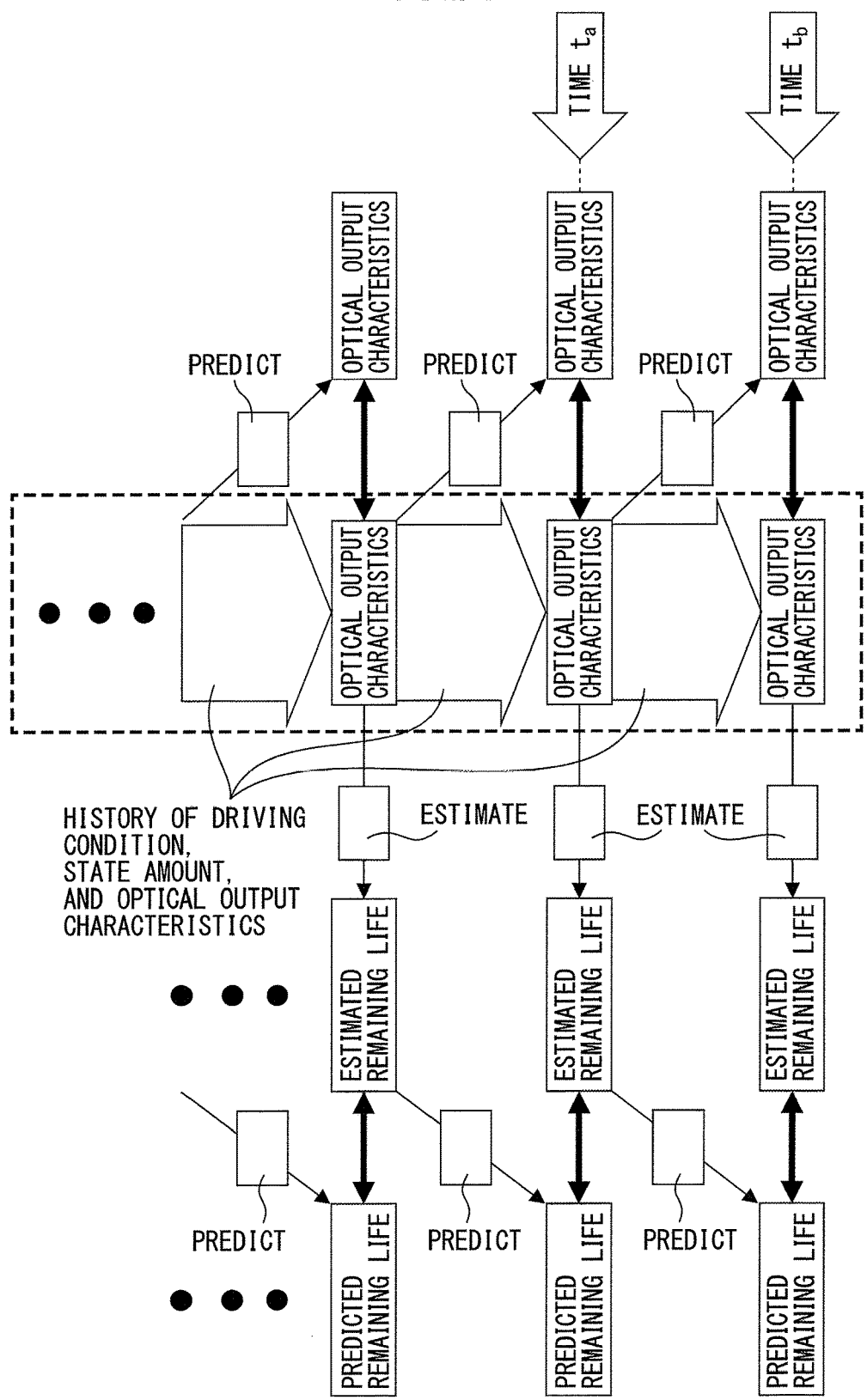
FIG. 6 is yet another block diagram schematically illustrating a flow of data.

In the laser apparatus 1, as illustrated in the schematic block diagrams of FIGS. 5 and 6, preferably, by a command from the control unit 4, a relationship between an applied voltage and an optical output with respect to the driving current of each LDU 2 is individually measured along a predetermined schedule to add optical output characteristics of each LDU 2 at the measurement time to the optical output characteristic recording unit 8. By individually driving each LDU 2 along the predetermined schedule to measure and add the optical output characteristics of each LDU 2 to the optical output characteristic recording unit 8, history of how the optical output characteristics has changed as a result of the LDU driving condition data output from the machine learning apparatus 6 between measurement intervals of the optical output characteristics is recorded, and by receiving the state amount of the laser apparatus 1 including the history of the optical output characteristics via the state amount observation unit, the influence of the history of the optical output characteristics on the result of the LDU driving condition data can be accurately learned. In addition, through collation of the prediction result with the estimation result of the remaining life of each LDU 2 and collation of the measurement result with the prediction result of the optical output characteristics of each LDU 2 at the time of measuring the optical output characteristics of each LDU 2, learning chances increase, thereby improving prediction accuracy of the remaining life or the optical output characteristics of each LDU 2 more.

Figure 10:
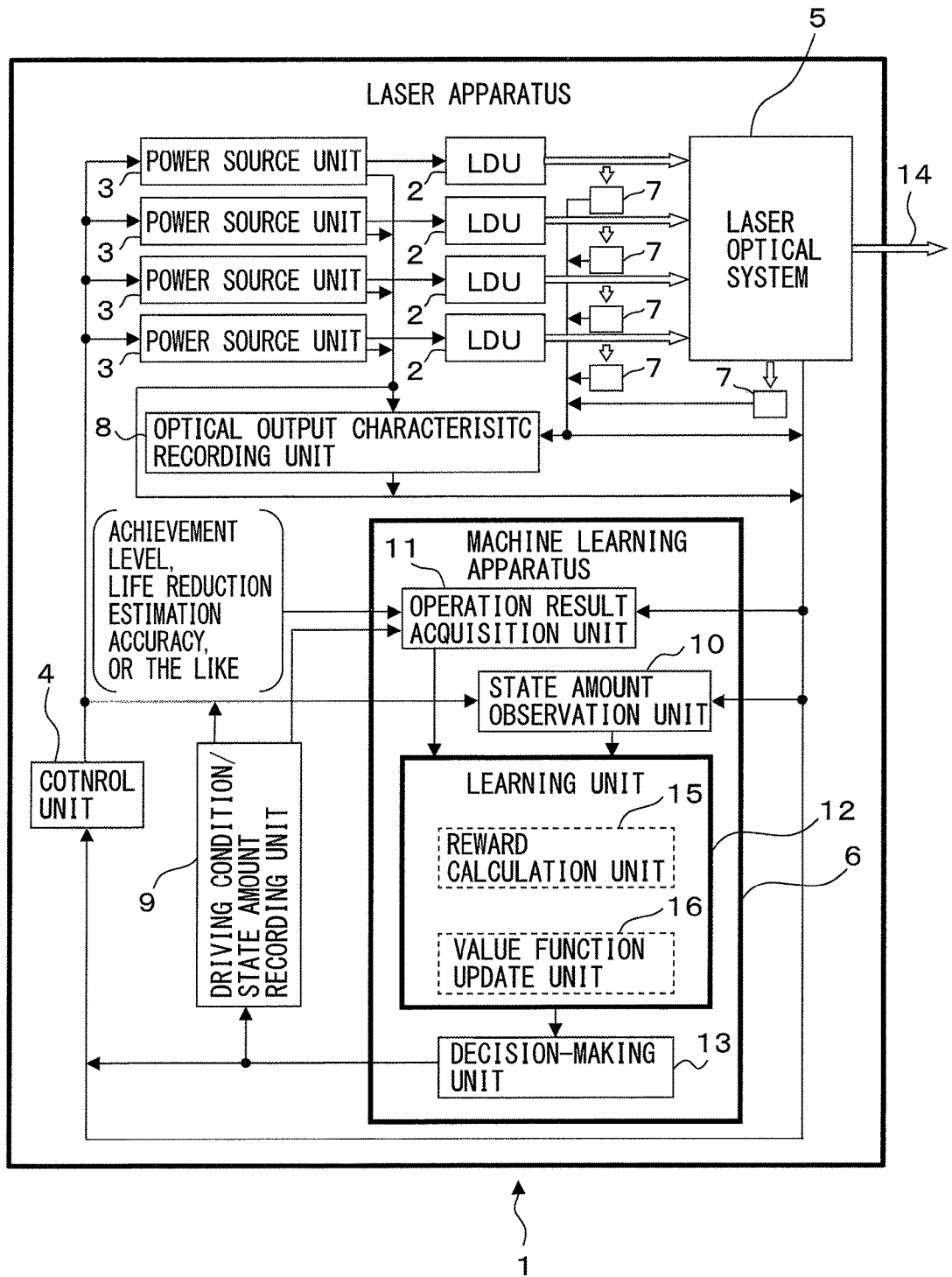
FIG. 10 is a block diagram illustrating a conceptual configuration of a laser apparatus according to yet another embodiment of the present invention.

Preferably, the laser apparatus 1 includes a plurality of optical output detection units 7 so as to simultaneously measure optical output characteristics of a plurality of LDUs 2. It is because to increase learning chances of the machine learning apparatus 6, it is preferred to relatively frequently measure the optical output characteristics of each LDU 2 by utilizing an interval between optical output commands to the laser apparatus 1 or the like. Accordingly, while the optical output characteristics are preferably measured within a short time, by including the plurality of optical output detection units 7, the optical output characteristics of the plurality of LDUs 2 can be simultaneously measured, and time for measuring the optical output characteristics of all the LDUs 2 can be shortened. Further, preferably, to enable simultaneous measurement of the optical output characteristics of all the LDUs 2, as illustrated in FIG. 10, in addition to the optical output detection unit 7 that measures the optical output of the laser light 14 emitted from the laser apparatus 1, at least one optical output detection unit 7 is provided for each LDU 2. By providing at least one optical output detection unit 7 for each LDU 2, even while the laser apparatus 1 emits the laser light 14 for laser-processing an object (workpiece) to be processed, though complete optical output characteristics such as each driving current dependency of an optical output of each LDU 2 within a predetermined entire driving current range cannot be obtained, an optical output with respect to a driving current in the middle of driving can be measured, and thus the optical output characteristics of each LDU 2 can be measured. Herein, such measurement of the optical output of the LDU 2 with respect to one driving current may be included in the optical output characteristic measurement of the LDU 2. Such a measurement result of the optical output of the LDU 2 with respect to one driving current may be included in the measurement result of the optical output characteristics of the LDU 2.

In the laser apparatus 1, the learning unit 12 can add, as a result of LDU driving condition data including at least a prediction result of a remaining life as a prediction result of characteristics of each LDU 2, an estimated remaining life of each LDU 2 estimated by referring to a learning result to the driving condition/state amount recording unit 9, and output and/or display, with time obtained by subtracting an estimated remaining life at a time $t_p$ after a time $t_s$ from an estimated remaining life at the time $t_s$ set as an effective driving time of each LDU 2 obtained by converting an actual driving time of each LDU 2 from the time $t_s$ to the time $t_p$ into a driving time on a standard driving condition, the estimated remaining life of each LDU 2 at the time $t_p$ as a remaining life of each LDU 2 at the time $t_p$.

Figure 11:
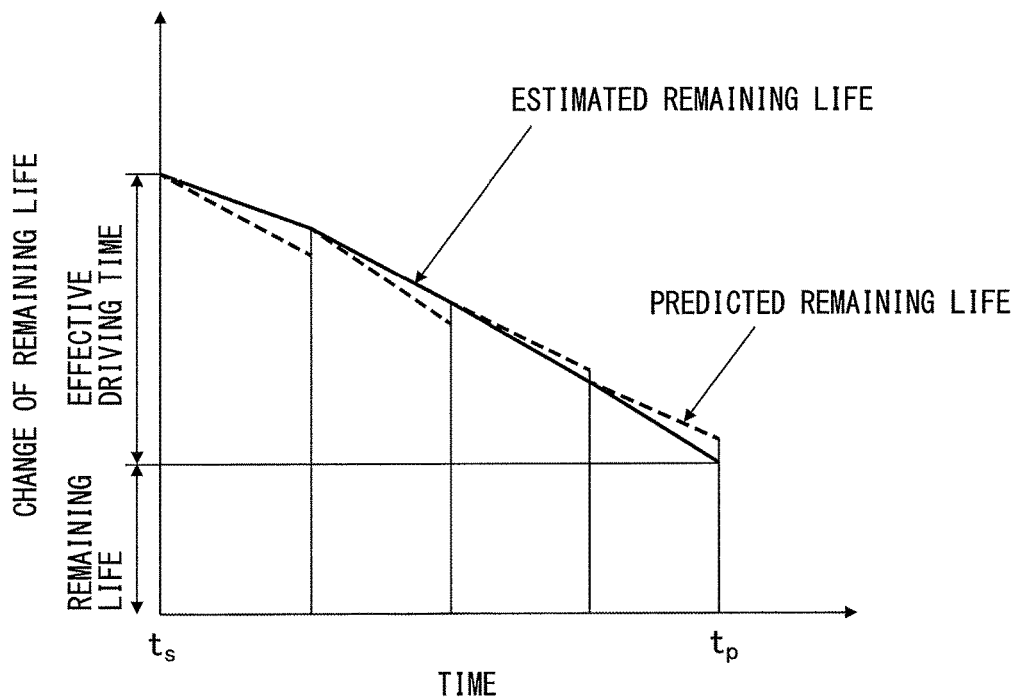
FIG. 11 is a graph illustrating a relationship between changes in estimated remaining life of an LDU and changes in predicted remaining life.

When through learning, on no matter what driving condition the LDU 2 has been driven, a remaining life taking into account all history of driving conditions of the LDU 2, the state amount of the laser apparatus 1 and the like thus far can be estimated, as illustrated in a schematic graph of FIG. 11, a change time in remaining time becomes effective driving time of each LDU 2 obtained by converting an actual driving time into a standard driving condition. Once the effective driving time of each LDU 2 is known, as long as the time $t_s$ is time when a predetermined inspection process before shipment is completed or time when the LDU 2 is driven for the first time after shipment, the effective driving time is effective cumulative driving time. Thus, before the end of the life, whether estimated whole life=effective cumulative driving time+estimated remaining life exhibits an abnormal value or the like can be checked. At the end of the life, highly accurate comparison with life guarantee or an average whole life of the LUD 2 or the like can be performed on the standard driving condition. Therefore, accurate life associated information that leads to reliable evaluation or improvement of the LDU 2 can be obtained.

In the laser apparatus 1, in response to an optical output command to the laser apparatus 1, through reference to the learning result via the learning unit 12, the decision-making unit 13 that outputs LDU driving condition data including prediction results of a remaining life and optical output characteristics of each LDU 2 can set a condition for selecting at least one of the following four driving condition modes or a condition for switching a driving condition mode among the driving condition modes: a driving condition mode for outputting LDU driving condition data where a total reduction amount of remaining lives of the LDUs 2 by driving of the LUDs 2 is predicted to be a minimum value (life top priority mode); a driving condition mode for outputting LDU driving condition data where photoelectric conversion efficiency of the laser apparatus 1 as a whole is roughly maximum efficiency within a condition range where a total reduction amount of the remaining lives of the LDUs 2 is predicted to be a predetermined multiple or lower of a minimum value (efficiency priority mode); a driving condition mode for outputting LDU driving condition data where a total reduction amount of the remaining lives of the LDUs 2 is predicted to be a minimum value within a condition range where photoelectric conversion efficiency of the laser apparatus 1 as a whole is a predetermined reduction rate or lower from maximum efficiency (life priority mode); and a driving condition mode for outputting LDU driving condition data where a reduction rate of a remaining life of each LDU 2 is predicted to be proportional to the remaining life of each LDU 2 (simultaneous exchanging mode).

After accurate prediction of the reduction amount of the remaining life by driving of the LDU 2 has been enabled, the LDU 2 can be driven in the abovementioned driving condition modes. When the life top priority mode is selected, a laser apparatus 1 of a long life can be realized. When the efficiency priority mode is selected, a laser apparatus 1 of high efficiency can be realized while taking a life into account. When the life priority mode is selected, a laser apparatus 1 of a long life can be realized while taking efficiency into account. When the simultaneous exchanging mode is selected, there is an advantage of being able to reduce the number of maintenance times because all the LDUs 2 substantially simultaneously reach ends of their lives. As a driving condition mode can be selected to be set as desired by a user, customer satisfaction is higher. By switching the driving condition mode midway, for example, by switching to the simultaneous exchanging mode at a late period of a life, setting such as that where exchanging periods of the LDUs 2 are similar while the lives are long can be set. The photoelectric conversion efficiency can be calculated from photoelectric conversion efficiency=optical output/(driving current×applied voltage) by measuring a driving current supplied to each LDU 2 and an applied voltage to the LDU 2 during optical output characteristic measurement of the LDU 2. The machine learning apparatus 6 receives, from the control unit 4, a condition such as that described above and set for the control unit 4, and the laser apparatus 1 can emit an instructed optical output, and decides and outputs LDU driving condition data matching the setting condition.

The LDU 2 with high photoelectric efficiency tends to be long in remaining life and limited in deterioration (reduction of remaining life) accompanying driving. Thus, no matter which of the abovementioned modes is selected, a greater amount of a driving current may tend to be allocated to the LDU 2 with high photoelectric efficiency. However, it is not clear as to at what quantitative rate of allocation each LDU 2 can be driven in a desired mode.

In addition, in the laser apparatus 1, the control unit 4 can read the LDU driving condition data output from the decision-making unit 13 in response to the optical output command to the laser apparatus 1 and recorded in the driving condition/state amount recording unit 9, and output, to the power source unit 3, the laser optical system 5, the optical output detection unit, and the optical output characteristic recording unit 8, LDU driving condition data including output command data to be instructed to the power source unit 3. In this case, preferably, in the laser apparatus 1 illustrated in FIG. 1, FIG. 8 or FIG. 10, a signal line for outputting the LDU driving condition data from the driving condition/state amount recording unit 9 to the control unit 4 is added.

Figure 12:
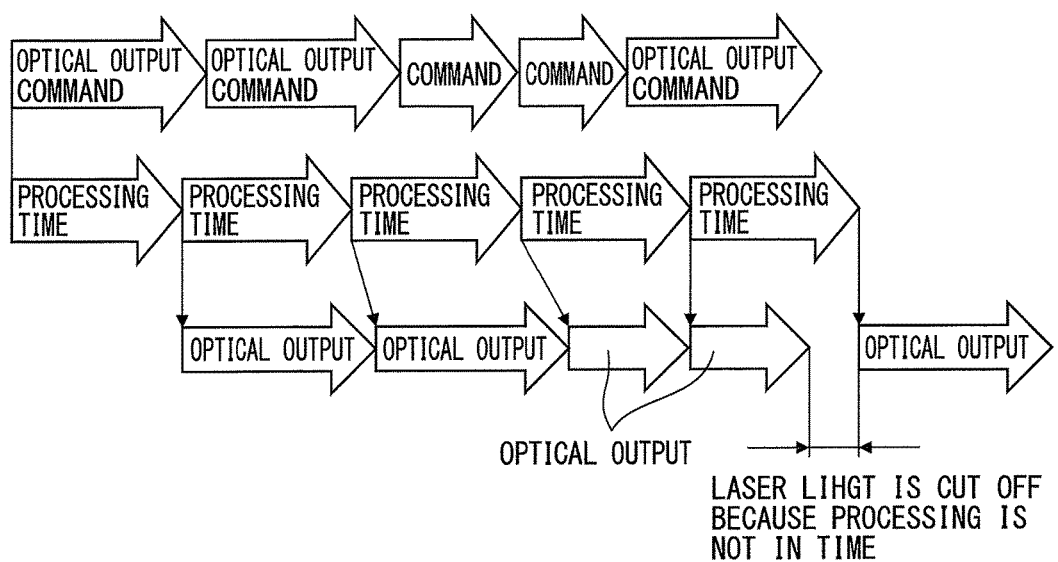
FIG. 12 is a diagram schematically illustrating passages of time of an optical output instruction, processing carried out by the machine learning apparatus, and an optical output.

Though dependent on performance of a processor of the machine learning apparatus 6, after the issuance of the optical output command to the laser apparatus 1, it may take time until the learning unit 12 receives data from the state amount observation unit and the operation result acquisition unit 11 and decides LDU driving condition data to be output. In such a case, in a flow from a left side to a right side as schematically illustrated in FIG. 12, when a laser light 14 is emitted in real time in response to a plurality of continuous optical output commands, there is a possibility that decision of LDU driving condition data will be delayed to disable smooth processing of the laser light 14. Therefore, preferably, before actual emission of the laser light 14, the abovementioned processing is carried out in advance in response to a series of continuous optical output commands, LDU driving condition data to be output is decided and recorded in the driving condition/state amount recording unit 9, and then the control unit 4 outputs output command data of the LDU driving condition data to the respective units of the laser apparatus 1 including the power source unit 3. This enables continuous emission of the laser light 14 as instructed in response to the series of optical output commands.

Lastly, a learning method of the machine learning apparatus 6 illustrated in FIG. 1, FIG. 8 or FIG. 10 will be described.

The machine learning apparatus 6 has a function for extracting a useful algorithm, a rule, a knowledge expression, a criterion or the like in a set of data input thereto by analysis, outputting a determination result, and learning knowledge. There are known a variety of machine learning methods, which can be largely classified into "reinforcement learning", "supervised learning", and "unsupervised learning". In addition, to realize these methods, there is a method referred to as "deep learning" for learning extraction of a feature amount itself. FIGS. 1 and 10 illustrate examples of laser apparatuses 1 including machine learning apparatuses 6 of reinforcement learning, and FIG. 8 illustrates an example of a laser apparatus 1 including a machine learning apparatuses 6 of supervised learning.

The reinforcement learning is a method for learning not only determination and classification but also an action to know an appropriate action with consideration given to interaction imposed on an environment by the action, in other words, a method of learning to maximize a reward obtained in the future. In the present embodiment, for example, as in a case where as a result of an action of outputting LDU driving condition data, deterioration of the LDU 2 progresses to change optical output characteristics and reduce a remaining life, the state amount (environment) of the laser apparatus 1 is affected, and how to act is learned by observing a surrounding environment, and thus the reinforcement learning may be applied because learning is carried out by obtaining a feedback in the form of affecting the environment and obtaining a reward from the environment.

However, in the reinforcement learning, learning is started from a state where a result of an action is totally unknown or known only incompletely, and it may not be easy to obtain a learning result enough to carry out an appropriate action from this state. In the present invention, an enormous volume of data may be provided until learning that enables highly accurate estimation of a remaining life of the LDU 2 over a lifetime. Thus, preferably, pre-learning is carried out by supervised learning where result (label) attached data that is a pair of input data and output data appropriate for learning is provided, and reinforcement learning is started with the state where the pre-learning is carried out by the supervised learning or the like set as an initial state.

The supervised learning is a learning method for learning, by providing a great amount of sets of given inputs and data of results (labels) to the machine learning apparatus 6, features included in the data sets, and inductively obtaining a model for estimating a result from the input, in other words, a relationship thereof. Certain learning effects are provided only by the supervised learning, and a remaining life of the LDU 2 can be predicted with a certain level of accuracy. Thus, the reinforcement learning may not be always carried out, and machine learning may be limited within the range of the supervised learning.

The unsupervised learning is a method for carrying out learning by an apparatus that learns how input data has been distributed by providing a great amount of only input data to the learning apparatus, and compresses, classifies or shapes the input data without providing any corresponding supervised output data. The unsupervised learning is different from the supervised learning in that "what to be output" is not predetermined. This method is used for extracting an essential structure present behind the data.

First, the reinforcement learning will be described. A problem of the reinforcement learning may be set as follows.

The machine learning unit 12 of the laser apparatus 1 observes a state of an environment including a state of the laser apparatus 1 to decide an action (outputting of LDU driving condition data).

The environment changes according to a certain algorithm, and the action may give a change to the environment.

A reward signal is returned for each action.

It is the sum of rewards in the future that is desired to be maximized.

Learning is started from a state where a result caused by the action is totally unknown or known only incompletely.

As representative reinforcement learning methods, Q learning and TD learning are known. Hereinafter, the case of the Q learning will be described, but a method is not limited to the Q learning.

The Q learning is a method for learning a value $Q(s, a)$ for selecting an action a under a given environment state s. In the state s, an action a of a highest value $Q(s, a)$ may be selected as an optimal action. However, at first, as a correct value of the value $Q(s, a)$ is not known for a combination of the state s with the action a, an agent (action subject) selects various actions a under the state s, and is given rewards for the actions a at the time. This way, the agent selects a better action, in other words, learns a correct value $Q(s, a)$.

Further, with a view to maximizing the sum of rewards obtained in the future as a result of the action, $Q(s, a)=E[\Sigma(\gamma_t)r^t]$ may be finally achieved. "E[ ]" represents an expected value, t represents time, $\gamma$ represents a parameter referred to as a discount rate described below, $r_t$ represents a reward at the time t, and $\Sigma$ represents the sum at the time t. The expected value in this formula is taken when a state changes according to the optimal action, and learned through searching as it is not known. An update formula for such a value $Q(s, a)$ can, for example, be represented by equation (1) described below.

In other words, the value function update unit 16 updates a value function $Q(s_t, a_t)$ by using the following equation (1):

$$Q(s_t, a_t) \leftarrow Q(s_t, a_t) + \alpha\left(r_{t+1} + \gamma \max_a Q(s_{t+1}, a) - Q(s_t, a_t)\right)$$

In the above equation, $s_t$ represents a state of the environment at the time t, and $a_t$ represents an action at the time t. The action $a_t$ changes the state to $s_{t+1}$. $r_{t+1}$ represents a reward that can be obtained via the change of the state. Further, a term with max is a Q value multiplied by $\gamma$ for a case where the action a for the highest Q value known at that time is selected under the state $s_{t+1}$. $\gamma$ is a parameter of $0<\gamma\leq1$, and referred to as a discount rate. $\alpha$ is a learning factor, which is in the range of $0<\alpha\leq1$.

The equation (1) represents a method for updating an evaluation value $Q(s_t, a_t)$ of the action $a_t$ in the state $s_t$ on the basis of the reward $r_{t+1}$ returned as a result of the action $a_t$. It indicates that when the sum of a reward $r_{t+1}$ and an evaluation value $Q(s_{t+1}, \max a_{t+1})$ of the best action max a in the next state based on action a is larger than the evaluation value $Q(s_t, a_t)$ of the action a in the state s, $Q(s_t, a_t)$ is increased, whereas when smaller, $Q(s_t, a_t)$ is decreased. In other words, it is configured such that the value of some action in some state is made to be closer to the reward that instantly comes back as a result and to the value of the best action in the next state based on that action.

For convenience, when the learning factor and the discount rate are 1, a result is represented by following equation (2):

$$Q(s_t, a_t) \leftarrow r_{t+1} + \max_a Q(s_{t+1}, a)$$

This update formula indicates that when an evaluation value $Q(s_{t+1}, \max a_{t+1})$ of the best action max a in the next environment state based on action a is larger than the evaluation value $Q(s_t, a_t)$ of the action a in the environment s, $Q(s_t, a_t)$ is increased, whereas when smaller, $Q(s_t, a_t)$ is decreased. In other words, it is configured such that the value of some action in some state is made to be closer to the value of the best action in the next state based on that action.

Methods of representing $Q(s, a)$ on a computer include a method in which the value is retained as an action value table for all state-action pairs (s, a) and a method in which a function approximate to $Q(s, a)$ is prepared. In the latter method, the abovementioned equation (1) can be implemented by adjusting parameters of the approximation function by a technique, such as stochastic gradient descent method. The approximation function may use a neural network.

Next, application of the supervised learning will be described. The supervised learning is a learning method for learning, by providing a great amount of sets of given inputs and data of results (labels) to the machine learning apparatus 6, features included in the data sets, and inductively obtaining a model for estimating a result from the input, in other words, a relationship thereof.

An operation of the machine learning apparatus that carries out the supervised learning includes two stages, namely, a learning stage and a prediction stage. At the learning stage, when supervising data including a value of a state variable (explanation variable) used as input data and a value of a target variable used as output data is provided, the machine learning apparatus that carries out the supervised learning learns outputting of the value of the target variable at the time of inputting of the value of the state variable, and constructs a prediction model for outputting the value of the target variable with respect to the value of the state variable. Then, at the prediction stage, when new input data (state variable) is provided, the machine learning apparatus that carries out the supervised learning predicts and outputs output data (target variable) according to the learning result (constructed prediction model). Here, the result (label) attached data recording unit 22 can hold result (label) attached data obtained thus far, and provide the result (label) attached data to the error calculation unit 20. Alternatively, the result (label) attached data of the laser apparatus 1 can be provided to the error calculation unit 20 of the laser apparatus 1 through a memory card, a communication line or the like.

As an example of learning of the machine learning apparatus that carries out the supervised learning, a regression formula of a prediction model similar to, for example, that of following equation (3) is set, and learning proceeds to adjust values of factors $a_0, a_1, a_2, a_3, \ldots$ so as to obtain a value of a target variable y when values taken by state variables $x_1, x_2, x_3, \ldots$ during the learning process are applied to the regression formula. The learning method is not limited to this method, but varies from one supervised learning algorithm to another.

$$y = a_0 + a_1 x_1 + a_2 x_2 + a_3 x_3 + \ldots + a_n x_n$$

As supervised learning algorithms, there are known various methods such as a neural network, a least squares method, and a stepwise method, and any of these supervised learning algorithms may be employed as a method applied to the present invention. As each supervised learning algorithm is known, detailed description thereof is omitted herein.

As described above, as the approximation algorithm of the value function in the reinforcement learning or as the learning model of the supervised learning or the unsupervised learning, the neural network can be used. Thus, the machine learning apparatus 6 preferably has the neural network.

Figure 13:
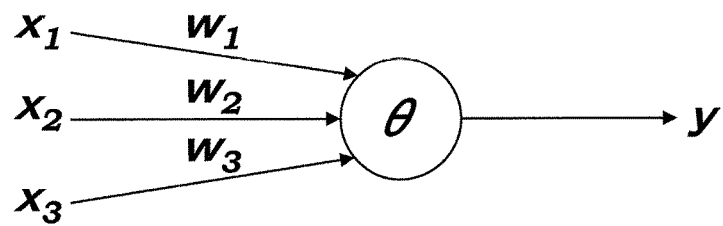
FIG. 13 is a diagram schematically illustrating a model of neurons.
Figure 14:
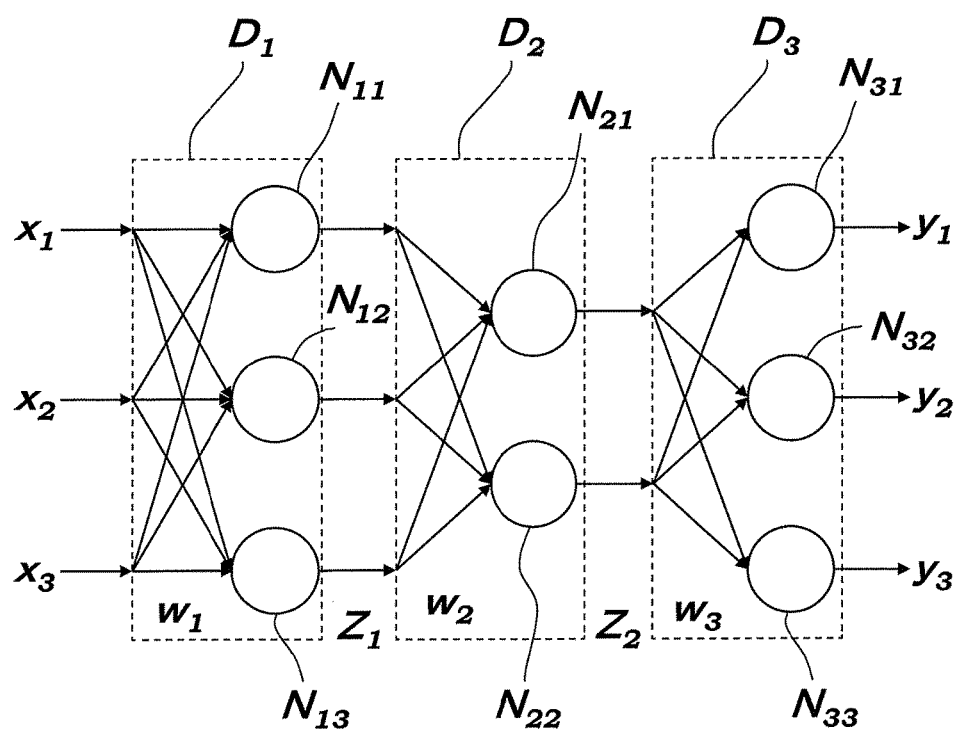
FIG. 14 is a diagram schematically illustrating a three-layer neural network configured by combining the neurons illustrated in FIG. 13.

FIG. 13 schematically illustrates a neuron model, and FIG. 14 schematically illustrates a three-layer neural network configured by combining neurons illustrated in FIG. 13. The neuron network includes an arithmetic unit, a memory, or the like that imitates a neuron model such as that illustrated in FIG. 13. The neuron outputs an output (result) y for a plurality of inputs x. Each input x ($x_1$ to $x_3$) is multiplied by a weight w ($w_1$ to $w_3$) corresponding to the input x. The neuron outputs the output y represented by following equation (4). The input x, the output y, and the weight w all are vectors.

$$y = f_k\left(\sum_{i=1}^{n} x_i w_i - \theta\right)$$

where $\theta$ is a bias, and $f_k$ is an activation function.

As illustrated in FIG. 14, a plurality of inputs x ($x_1$ to $x_3$) is input from the left side of the neural network, and a result y ($y_1$ to $y_3$) is output from the right side. The inputs $x_1$ to $x_3$ are multiplied by corresponding weights and input to the three neurons $N_{11}$ to $N_{13}$. The weights applied to these inputs are collectively indicated by $w_1$.

The neurons $N_{11}$ to $N_{13}$ output $z_{11}$ to $z_{13}$, respectively. In FIG. 14, $z_{11}$ to $z_{13}$ are collectively represented as a feature vector $z_1$, and can be regarded as a vector obtained by extracting the feature amounts of the input vector. The feature vector $z_1$ is a feature vector between the weight $w_1$ and the weight $w_2$. The feature vectors $z_{11}$ to $z_{13}$ are multiplied by a corresponding weight and input to each of the two neurons $N_{21}$ and $N_{22}$. The weights applied to these feature vectors are collectively represented as $w_2$. The neurons $N_{21}$ and $N_{22}$ output $z_{21}$ and $z_{22}$, respectively. In FIG. 14, $z_{21}$ and $z_{22}$ are collectively represented as a feature vector $z_2$. The feature vector $z_2$ is a feature vector between the weight $w_2$ and the weight $w_3$. The feature vectors $z_{21}$ and $z_{22}$ are multiplied by a corresponding weight and input to each of the three neurons $N_{31}$ to $N_{33}$. The weights multiplied to these feature vectors are collectively represented as $w_3$.

Finally, the neurons $N_{31}$ to $N_{33}$ output results $y_1$ to $y_3$, respectively. An operation of the neural network includes a learning mode and a value prediction mode: in the learning mode, the weight w is learned by using a learning data set, and in the prediction mode, an action of outputting LDU driving condition data is determined by using parameters thereof. Here, the apparatus can be actually operated in the prediction mode to output the LDU driving condition data and instantly learn and cause the resulting data to be reflected in the subsequent action (on-line learning), and a group of pre-collected data can be used to perform collective learning and implement a detection mode with the parameter subsequently for quite a while (batch learning). An intermediate case is also possible, where a learning mode is introduced each time data is accumulated to a certain degree.

The weights $w_1$ to $w_3$ can be learned by a backpropagation. Error information enters from the right side and flows to the left side. The backpropagation is a technique for adjusting (learning) each weight so as to minimize a difference between an output y when an input x is input and a true output y (teacher) for each neuron.

The number of intermediate layers (hidden layers) of the neural network illustrated in FIG. 14 is one. However, the neural network can increase the layers to two or more, and when the number of intermediate layers is two or more, it is referred to as deep learning.

The application of the reinforcement learning and the supervised learning has been described. However, the machine learning method applied to the present invention is not limited to these methods. Various methods such as "supervised learning", "unsupervised learning", and "half-supervised learning", and "reinforcement learning" usable in the machine learning apparatus 6 can be applied.

The abovementioned laser apparatus 1 according to the embodiment includes one machine learning apparatus 6 for one laser apparatus 1 as illustrated in FIG. 1, FIG. 8 or FIG. 10. However, in the present invention, the numbers of laser apparatuses 1 and machine learning apparatuses 6 are not limited to one. Preferably, a plurality of laser apparatuses 1 is installed, and a plurality of machine learning apparatuses 6 provided for each laser apparatus 1 share or exchange data with each other via a communication medium. Sharing data including a learning result obtained by each laser apparatus 1 enables a more accurate learning effect to be provided within a shorter time, and more appropriate LDU driving condition data to be output.

Furthermore, the machine learning apparatus 6 may be located in the laser apparatus 1 or outside the laser apparatus 1, and shared by a plurality of laser apparatuses 1. The machine learning apparatus 6 may be installed on a cloud server. Not only the learning effect can be shared, but also the data can be centrally controlled, learning can be carried out by using a large high-performance processor, a learning speed and learning accuracy can be increased, and more appropriate LDU driving condition data can be output. In addition, time for deciding LDU driving condition data to be output can be shortened. For such a machine learning apparatus 6, a general-purpose computer or a processor may be used. However, when general-purpose computing on graphics processing units (GPGPU), a large PC cluster or the like is applied, processing can be performed at a higher speed.

Effects of Invention

According to the first aspect of the present invention, through LDU driving under conditions where history of driving conditions of the LDU (LD unit) or history of optical output characteristics varies, LDU diving condition data including at least a prediction result of a remaining life as a prediction result of characteristics of each LDU is learned in association with a state amount of the laser apparatus and a result of the LDU driving condition data. Thus, prediction accuracy of the remaining life of the LDU can be improved, and even the LDU driven on various driving conditions can be driven under an optimal driving condition accurately predicting a change in remaining life.

According to the second aspect of the present invention, by including the prediction result of the optical output characteristics in the prediction result of characteristics of the LDU, prediction accuracy of the optical output characteristics of the LDU can be improved, thereby improving prediction accuracy of the remaining life of the LDU. This is because, regarding the remaining life, at least in the initial learning period, except for at the life end, it is difficult to verify whether the prediction result of the remaining life is correct. In addition, the optical output characteristics can always be measured accurately, and prediction accuracy can be verified. A life comes to an end when a predetermined optical output cannot be obtained any more at a predetermined driving current, and remaining life=0 time is set. Accordingly, the optical output characteristics have a close relationship with a remaining life.

According to the third aspect of the present invention, by estimating, at given time such as the time $t_m$, the remaining life of each LDU in view of the latest data of the optical output characteristics of each LDU at the given time in addition to the history of the optical output characteristics, the LDU driving condition data and the state amount of the laser apparatus thus far, a remaining life higher in accuracy than the previously predicted remaining life can be obtained.

According to the fourth aspect of the present invention, a temperature of the LDU or the member thermally connected to the LDU is measured, and a temperature condition of each LDU is employed as a state amount of the laser apparatus. Thus, for example, while from the flowing-in side of the refrigerant to the flowing-out side, a refrigerant temperature increases due to heat generation of the LDU to generate a temperature gradient, accurate LDU driving condition data including a temperature condition such as a condition that the whole life of the LDU is shortened when the LDU is driven at a high temperature can be learned, thereby improving the prediction accuracy of the remaining life of the LDU. In addition, learning can be carried out in view of a temperature or humidity around the LDU that may affect the life of the LDU.

According to the fifth aspect of the present invention, the learning unit carries out learning so as to be able to highly accurately predict a remaining life by providing a plus reward when a difference between a prediction result and an estimation result of the remaining life is small and a minus reward when the difference between the prediction result and the estimation result of the remaining life is large. In addition, optical output characteristics having a close relationship with the remaining life can be highly accurately predicted by providing a plus reward when a difference between a prediction result and a measurement result of the optical output characteristics is small and a minus reward when the difference between the prediction result and the measurement result of the optical output characteristics is large, thereby improving prediction accuracy of the remaining life. Learning is carried out by obtaining a feedback in the form of affecting the environment and obtaining a reward from the environment. Accordingly, the learning can proceed even when input data and output data appropriate for learning are not provided as a pair.

According to the sixth aspect of the present invention, the learning unit carries out learning so as to be able to highly accurately predict a remaining life by calculating a difference between a prediction result and an estimation result of a remaining life and updating the learning model to reduce the difference. Further, optical output characteristics having a close relationship with the remaining life can be highly accurately predicted by calculating a difference between a prediction result and a measurement result of optical output characteristics and updating the learning model to reduce the difference, thereby improving prediction accuracy of the remaining life. By providing a pair of input data and output data appropriate for learning, the learning can proceed relatively easily.

According to the seventh aspect of the present invention, by the laser apparatus 1 including the machine learning apparatus, for example, for a setting condition such a condition that a driving current is allocated to each LDU so as to minimize a total reduction amount of the remaining lives of the LDUs in response to a given optical output command to the laser apparatus, each LDU can be driven under an optimal driving condition.

According to the eighth aspect of the present invention, by individually driving each LDU along the predetermined schedule to measure and add the optical output characteristics of each LDU to the optical output characteristic recording unit, history of how the optical output characteristics has changed as a result of the LDU driving condition data output from the machine learning apparatus between measurement intervals of the optical output characteristics is recorded, and by receiving the state amount of the laser apparatus including the history of the optical output characteristics via the state amount observation unit, the influence of the history of the optical output characteristics on the result of the LDU driving condition data can be accurately learned.

According to the ninth aspect of the present invention, to increase learning chances, it is preferred to frequently measure the optical output characteristics of each LDU by utilizing an interval between optical output commands to the laser apparatus or the like. Accordingly, while the optical output characteristics are preferably measured within a short time, by including the plurality of optical output detection units, the optical output characteristics of the plurality of LDUs can be simultaneously measured, and time for measuring the optical output characteristics of all the LDUs can be shortened.

According to the tenth aspect of the present invention, when through learning, on no matter what driving condition the LDU has been driven, a remaining life taking into account all history of driving conditions of the LDU, the state amount of the laser apparatus and the like thus far can be estimated, a change time in remaining time becomes effective driving time of each LDU obtained by converting actual driving time into a standard driving condition. Thus, at the end of the life, highly accurate comparison with life guarantee or an average whole life of the LUD or the like can be performed on the standard driving condition, and accurate life associated information that leads to reliable evaluation or improvement of the LDU can be obtained.

According to the eleventh aspect of the present invention, after accurate prediction of the reduction amount of the remaining life by driving of the LDU has been enabled, the LDU can be driven in the abovementioned driving condition modes. When the life top priority mode is selected, a laser apparatus of a long life can be realized. When the efficiency priority mode is selected, a laser apparatus of high efficiency can be realized while taking a life into account. When the life priority mode is selected, a laser apparatus of a long life can be realized while taking efficiency into account. When the simultaneous exchanging mode is selected, the number of maintenance times can be reduced because all the LDUs substantially simultaneously reach ends of their lives. As a driving condition mode can be selected to be set as desired by a user, customer satisfaction is higher. By switching the driving condition mode midway, for example, by switching to the simultaneous exchanging mode at a late period of a life, setting such as that where exchanging periods of the LDUs are similar while the lives are long can be set.

According to the twelfth aspect of the present invention, though dependent on performance of a processor of the machine learning apparatus, after the issuance of the optical output command to the laser apparatus, it may take time until the learning unit receives data from the state amount observation unit and the operation result acquisition unit and decides LDU driving condition data to be output. In such a case, when a laser light is emitted in real time in response to a plurality of continuous optical output commands, there is a possibility that decision of LDU driving condition data will be delayed to disable smooth processing of the laser light. Therefore, before actual emission of the laser light, the abovementioned processing is carried out in advance in response to a series of continuous optical output commands, LDU driving condition data to be output is decided and recorded in the driving condition/state amount recording unit, and then the control unit outputs the LDU driving condition data including output command data to the respective units of the laser apparatus including the power source unit. This enables continuous emission of the laser light as instructed in response to the series of optical output commands.

According to the thirteenth aspect of the present invention, through sharing of data including a learning result obtained by each laser apparatus, a more accurate learning effect can be provided within a shorter time, and more appropriate LDU driving condition data can be output.

According to the fourteenth aspect of the present invention, not only the learning effect can be shared, but also the data can be centrally controlled, learning can be carried out by using a large high-performance processor, a learning speed and learning accuracy can be increased, and more appropriate LDU driving condition data can be output. In addition, time for deciding LDU driving condition data to be output can be shortened. The machine learning apparatus may be installed on a cloud server.

According to the fifteenth aspect of the present invention, an effect substantially similar to that of the first invention can be provided.

According to the sixteenth aspect of the present invention, an effect substantially similar to that of the second invention can be provided.

The exemplary embodiments of the present invention have been described. As obvious to those skilled in the art, various changes, omissions and additions can be made without departing from the scope and the spirit of the present invention.

The invention claimed is:

1. A machine learning apparatus for a laser apparatus that is provided with: a plurality of LD units including at least one or more laser diode modules; a power source unit that individually supplies a driving current to each LD unit; and a control unit that independently controls, for each LD unit, the driving current injected from the power source unit to each LD unit, and emits a laser light via a laser optical system by using a laser light from the plurality of LD units as a laser light source or as an excitation light source for laser oscillation, the machine learning apparatus being configured to learn LD unit driving condition data including output command data instructed to the power source unit, the machine learning apparatus comprising:

a state amount observation unit that observes a state amount of the laser apparatus including output data from the power source unit, at least one or more optical output detection units that measure an optical output of the laser light, an optical output characteristic recording unit that records history of a measurement result of optical output characteristics of each LD unit obtained from the driving current output from the power source unit and the optical output, and a driving condition/state amount recording unit configured to record history of the LD unit driving condition data including at least a prediction result of a remaining life of each LD unit as a prediction result of characteristics of each LD unit output from the machine learning apparatus and history of the state amount of the laser apparatus;

an operation result acquisition unit that acquires, as results of the LD unit driving condition data, a difference between the prediction result of the characteristics of each LD unit including at least the prediction result of the remaining life of each LD unit recorded in the driving condition/state amount recording unit and the measurement result of the optical output characteristics of each LD unit and/or an estimation result from the measurement result;

a learning unit that receives an output from the state amount observation unit and an output from the operation result acquisition unit, and learns the LD unit driving condition data including at least the prediction result of the remaining life as the prediction result of the characteristics of each LD unit in association with the state amount of the laser apparatus and the results of the LD unit driving condition data; and a decision-making unit that decides, by referring to a learning result of the learning unit, an LD unit driving condition data including at least a prediction result of the remaining life as the prediction result of the characteristics of each LD unit.

2. The machine learning apparatus according to claim 1, wherein:

a prediction result of the optical output characteristics of each LD unit is also included as a prediction result of the characteristics of each LD unit in the LD unit driving condition data output from the machine learning apparatus to be recorded in the driving condition/state amount recording unit;

a difference between the prediction result of the optical output characteristics of each LD unit and the estimation result is included in data acquired by the operation result acquisition unit as the result of the LD unit driving condition data; and the learning unit learns the LD unit driving condition data including at least the prediction result of the remaining life and the prediction result of the optical output characteristics as the prediction results of the characteristics of each LD unit in association with the state amount of the laser apparatus and the results of the LD unit driving condition data.

3. The machine learning apparatus according to claim 1, wherein the learning unit has a function for estimating, on the basis of optical output characteristics of each LD unit at given time, history of optical output characteristics of each LD unit recorded in the optical output characteristic recording unit up to the given time, and history of the LD unit driving condition data and history of the state amount of the laser apparatus recorded in the driving condition/state amount recording unit up to the given time, a remaining life of each LD unit at the given time by referring to the learning result of the LD unit driving condition data including at least the prediction result of the remaining life as the prediction result of the characteristics of each LD unit.

4. The machine learning apparatus according to claim 1, wherein at least one of output data from at least one or more temperature detection units that detect a temperature of at least one of each LD unit and a member thermally connected to each LD unit, output data from a refrigerant temperature detection unit that detects a temperature of a refrigerant for cooling each LD unit, output data from an environmental temperature detection unit that detects an environmental temperature of each LD unit, output data from a flow rate detection unit that detects a flow rate of the refrigerant, and output data from a humidity detector that detects environmental humidity of each LD unit is included in the state amount of the laser apparatus input to the state amount observation unit.

5. The machine learning apparatus according to claim 1, wherein the learning unit has a value function for defining a value of the LD unit driving condition data including at least the prediction result of the remaining life as the prediction result of the characteristics of each LD unit, the machine learning apparatus further comprises a reward calculation unit, the reward calculation unit is configured to:
provide a plus reward according to a difference or a ratio when the difference between a prediction result at second time predicted with an estimation result at first time set as a starting point in a remaining life of each LD unit predicted or estimated as a result of the LD unit driving condition data instructed to each LD unit from the first time to the second time after the first time and recorded in the driving condition/state amount recording unit and an estimation result at the second time is smaller than a predetermined value or a predetermined ratio;
provide a minus reward according to the difference or a size of the ratio when the difference between the prediction result and the estimation result of the remaining life is larger than the predetermined value or the predetermined ratio;
when the LD unit driving condition data includes the prediction result of the optical output characteristics as the prediction result of the characteristics of each LD unit, provide a plus reward according to a difference or a ratio when the difference between a prediction result at the second time predicted with a measurement result at the first time set as a starting point in optical output characteristics of each LD unit obtained as a result of the LD unit driving condition data instructed to each LD unit from the first time to the second time and recorded in the driving condition/state amount recording unit and a measurement result at the second time is smaller than a predetermined value or a predetermined ratio; and
provide a minus reward according to the difference or the ratio when the difference between the prediction result and the measurement result of the optical output characteristics is larger than the predetermined value or the predetermined ratio, and
the machine learning apparatus further comprises a value function update unit that updates the value function according to the reward.

6. The machine learning apparatus according to claim 1, wherein the learning unit has a learning model for learning the LD unit driving condition data including at least the prediction result of the remaining life as the prediction result of the characteristics of each LD unit, the machine learning apparatus further comprises an error calculation unit, the error calculation unit is configured to:
calculate a difference between a prediction result at second time predicted with an estimation result at first time set as a starting point in a remaining life of each LD unit predicted or estimated as a result of the LD unit driving condition data instructed to each LD unit from the first time to the second time, which is after the first time, and recorded in the driving condition/state amount recording unit and an estimation result at the second time; and
when the LD unit driving condition data includes the prediction result of the optical output characteristics as the prediction result of the characteristics of each LD unit, calculate a difference between a prediction result at the second time predicted with a measurement result at the first time set as a starting point in optical output characteristics of each LD unit obtained as a result of the LD unit driving condition data instructed to each LD unit from the first time to the second time and recorded in the driving condition/state amount recording unit and a measurement result at the second time, and
the machine learning apparatus further comprises a learning model update unit that updates the learning model according to the difference calculated by the error calculation unit.

7. A laser apparatus provided with the machine learning apparatus according to claim 1,
the laser apparatus comprising a control unit that controls each of the power source unit configured to supply a driving current to each of the LD units, the laser optical system, the optical output detection unit, the optical output characteristic recording unit, and the driving condition/state amount recording unit.

8. The laser apparatus according to claim 7, wherein in response to a command from the control unit, a relationship between an applied voltage and an optical output with respect to the driving current of each LD unit is individually measured along a predetermined schedule to add, in the optical output characteristic recording unit, optical output characteristics of each LD unit of measurement time.

9. The laser apparatus according to claim 7, further comprising a plurality of optical output detection units to simultaneously measure the optical output characteristics of the plurality of LD units.

10. The laser apparatus according to claim 7,
wherein the learning unit is configured to:
add, as a result of the LD unit driving condition data including at least the prediction result of the remaining life as the prediction results of the characteristics of each LD unit, an estimated remaining life of each LD unit estimated by referring to a learning result to the driving condition/state amount recording unit; and
output or display, with time obtained by subtracting an estimated remaining life at fourth time after third time from an estimated remaining life at the third time set as effective driving time of each LD unit which is converted from actual driving time of each LD unit from the third time to the fourth time into driving time on a standard driving condition, the estimated remaining life of each LD unit at the fourth time as a remaining life of each LD unit at the fourth time.

11. The laser apparatus according to claim 7, wherein in response to an optical output command to the laser apparatus, through reference to the learning result via the learning unit, the decision-making unit that outputs the LD unit driving condition data including the prediction results of the remaining life and the optical output characteristics of each LD unit sets a condition for selecting at least one of four driving condition modes or a condition for switching a driving condition mode among the driving condition modes,
the four driving condition modes being: a life top priority mode for outputting LD unit driving condition data where a total reduction amount of remaining lives of the LD units by driving of the LD units is predicted to be a minimum value; an efficiency priority mode for outputting LD unit driving condition data where photoelectric conversion efficiency of the laser apparatus as a whole is roughly maximum efficiency within a condition range where a total reduction amount of the remaining lives of the LD units is predicted to be a predetermined multiple or lower of the minimum value; a life priority mode for outputting LD unit driving condition data where a total reduction amount of the remaining lives of the LD units is predicted to be a minimum value within a condition range where the photoelectric conversion efficiency of the laser apparatus as a whole is a predetermined reduction rate or lower from the maximum efficiency; and a simultaneous exchanging mode for outputting LD unit driving condition data where a reduction rate of the remaining life of each LD unit is predicted to be proportional to the remaining life of each LD unit.

12. The laser apparatus according to claim 7, wherein in response to an optical output command to the laser apparatus, the control unit reads the LD unit driving condition data output from the decision-making unit and recorded in the driving condition/state amount recording unit, and outputs the LD unit driving condition data including output command data instructed to the power source unit to the power source unit, the laser optical system, the optical output detection unit, and the optical output characteristic recording unit.

13. The laser apparatus according to claim 7, wherein:
a plurality of laser apparatuses each of which corresponds to the laser apparatus are present; and
a plurality of machine learning apparatuses each of which corresponds to the machine learning apparatus and which are installed in the respective laser apparatuses share or exchange data with each other via a communication medium.

14. The laser apparatus according to claim 13, wherein the machine learning apparatus is shared by the plurality of laser apparatuses via the communication medium.

15. A machine learning method for learning LD unit driving condition data including output command data instructed to a power source unit and at least a prediction result of a remaining life as a prediction result of characteristics of each LD unit,
the method comprising:
observing a state amount of a laser apparatus including output data from an optical output characteristic recording unit that records history of a measurement result of optical output characteristics of each LD unit obtained from the driving current output from the power source unit and an optical output, and a driving condition/state amount recording unit that records history of the LD unit driving condition data including at least a prediction result of a remaining life of each LD unit as a prediction result of characteristics of each LD unit output from a machine learning apparatus and history of the state amount of the laser apparatus;
receiving, as results of the LD unit driving condition data, a difference between the prediction result of the characteristics of each LD unit including at least the prediction result of the remaining life of each LD unit recorded in the driving condition/state amount recording unit and the measurement result of the optical output characteristics of each LD unit and/or an estimation result from the measurement result; and
learning the LD unit driving condition data including the output command data instructed to the power source unit and at least the prediction result of the remaining life as the prediction result of the characteristics of each LD unit in association with the state amount of the laser apparatus and the results of the LD unit driving condition data.

16. The machine learning method according to claim 15, wherein;
a prediction result of the optical output characteristics of each LD unit is also included as a prediction result of the characteristics of each LD unit in the LD unit driving condition data output from the machine learning apparatus to be recorded in the driving condition/state amount recording unit;
a difference between the prediction result of the optical output characteristics of each LD unit and the estimation result is included in data acquired by an operation result acquisition unit as the result of the LD unit driving condition data; and
a learning unit learns the LD unit driving condition data including at least the prediction result of the remaining life and the prediction result of the optical output characteristics as the prediction results of the characteristics of each LD unit in association with the state amount of the laser apparatus and the results of the LD unit driving condition data.

* * * * *